(12) United States Patent
Gossner et al.

(10) Patent No.: US 8,476,711 B2
(45) Date of Patent: Jul. 2, 2013

(54) SYSTEM FOR PROTECTION AGAINST ELECTROSTATIC DISCHARGES IN AN ELECTRICAL CIRCUIT

(75) Inventors: Harald Gossner, Riemerling (DE); Christian Russ, Diedorf (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 12/176,659

(22) Filed: Jul. 21, 2008

(65) Prior Publication Data

US 2008/0277729 A1 Nov. 13, 2008

Related U.S. Application Data

(63) Continuation of application No. 11/506,683, filed on Aug. 18, 2006, now Pat. No. 7,919,816.

(30) Foreign Application Priority Data

Aug. 19, 2005 (DE) .......................... 10 2005 039 365

(51) Int. Cl.
    *H01L 27/06* (2006.01)
(52) U.S. Cl.
    USPC .................................. 257/360; 257/E27.016
(58) Field of Classification Search
    USPC ............................. 257/360, E27.016; 361/56
    See application file for complete search history.

(56) References Cited

U.S. PATENT DOCUMENTS

| 4,064,525 A * | 12/1977 | Kano et al. ..................... 257/262 |
| 5,526,315 A | 6/1996 | Kaya et al. |
| 5,610,790 A | 3/1997 | Staab et al. |
| 6,239,958 B1 | 5/2001 | Kato et al. |
| 6,413,802 B1 | 7/2002 | Hu et al. |
| 6,919,602 B2 | 7/2005 | Lin et al. |
| 7,348,642 B2 * | 3/2008 | Nowak .......................... 257/401 |
| 2004/0036126 A1 * | 2/2004 | Chau et al. .................... 257/401 |

(Continued)

FOREIGN PATENT DOCUMENTS

| DE | 10103297 | 8/2002 |
| JP | 5-335567 | 12/1993 |

(Continued)

OTHER PUBLICATIONS

ESD Evaluation of the Emerging MuGFET Technology, C. Russ, H. Gossner, T. Schulz, N. Chaudhary, W. Xiong, A. Marshall, C. Duvvury, K. Schruefer, C.R. Cleavelin, EOS/ESDS Symposium, 2005, pp. 1-4.

(Continued)

*Primary Examiner* — Marc Armand

(57) ABSTRACT

A gate controlled fin resistance element for use as an electrostatic discharge (ESD) protection element in an electrical circuit has a fin structure having a first connection region, a second connection region and a channel region formed between the first and second connection regions. Furthermore, the fin resistance element has a gate region formed at least over a part of the surface of the channel region. The gate region is electrically coupled to a gate control device, which gate control device controls an electrical potential applied to the gate region in such a way that the gate controlled fin resistance element has a high electrical resistance during a first operating state of the electrical circuit and a lower electrical resistance during a second operating state, which is characterized by the occurrence of an ESD event.

22 Claims, 12 Drawing Sheets

U.S. PATENT DOCUMENTS

| | | | |
|---|---|---|---|
| 2004/0219760 A1* | 11/2004 | Chaine et al. | 438/400 |
| 2005/0056892 A1 | 3/2005 | Seliskar | |
| 2005/0087811 A1* | 4/2005 | Liao et al. | 257/368 |
| 2005/0162928 A1* | 7/2005 | Rosmeulen | 365/185.29 |
| 2006/0063319 A1* | 3/2006 | Ono | 438/197 |
| 2006/0113600 A1 | 6/2006 | Salling et al. | |
| 2006/0114628 A1 | 6/2006 | Fukuda | |
| 2006/0157791 A1 | 7/2006 | Lee et al. | |
| 2006/0164180 A1* | 7/2006 | Nowak | 333/103 |
| 2006/0214233 A1* | 9/2006 | Ananthanarayanan et al. | 257/353 |
| 2006/0273372 A1 | 12/2006 | Voldman et al. | |
| 2007/0090460 A1 | 4/2007 | Agam et al. | |

FOREIGN PATENT DOCUMENTS

| | | |
|---|---|---|
| JP | 08-051184 | 2/1996 |
| JP | 11186501 A | 7/1999 |
| JP | 2002-16263 | 1/2002 |
| JP | 2004-55583 | 2/2004 |
| TW | 512510 | 12/1990 |
| TW | 1220314 | 9/1992 |
| TW | 200511551 | 9/1992 |
| TW | 512510 B | 12/2002 |
| TW | I220314 B | 8/2004 |
| TW | 200511551 A | 3/2005 |
| WO | WO 2004051749 A1 | 6/2004 |

OTHER PUBLICATIONS

EPFL Electronics Laboratories Advanced Engineering Course on Circuit Design Challenges in Nanometer-Scale CMOS, Part I, Lausanne, Jul. 4-8, 2005, pp. 1-20.

Taiwanese Office Action.

Japanese Office Action with English Translation dated May 18, 2010.

English Abstract of TWI220314B; Aug. 11, 2004.

English Abstract of TW512510B; Dec. 1, 2002.

English Abstract of TW200511551A; Mar. 16, 2005.

* cited by examiner

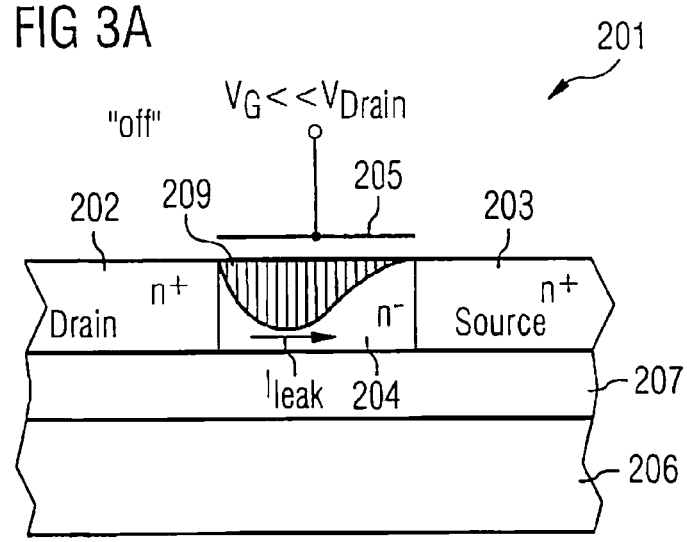
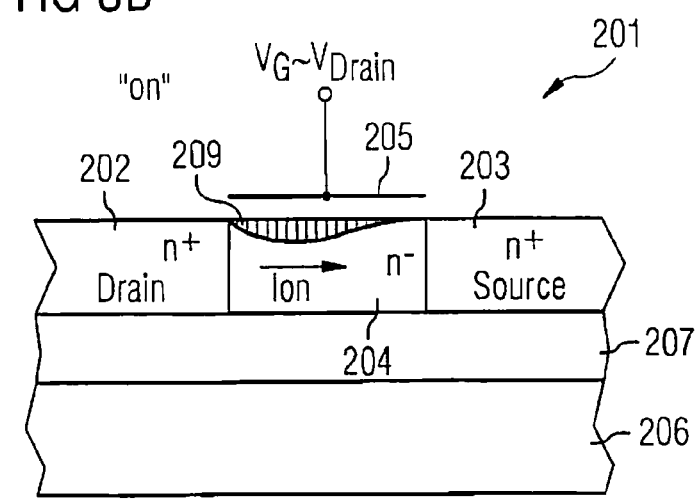

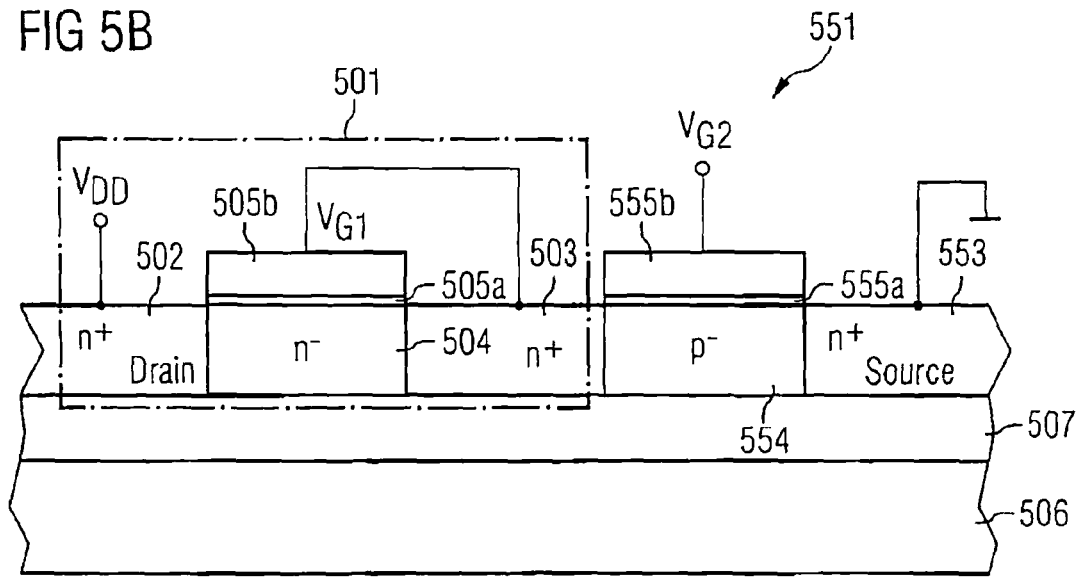
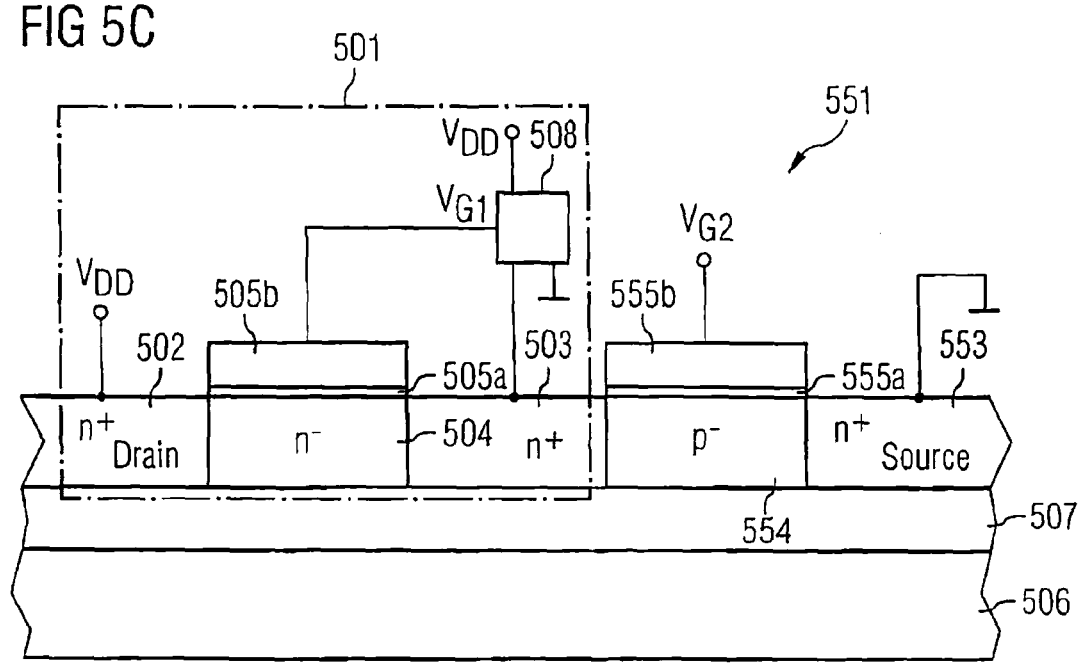

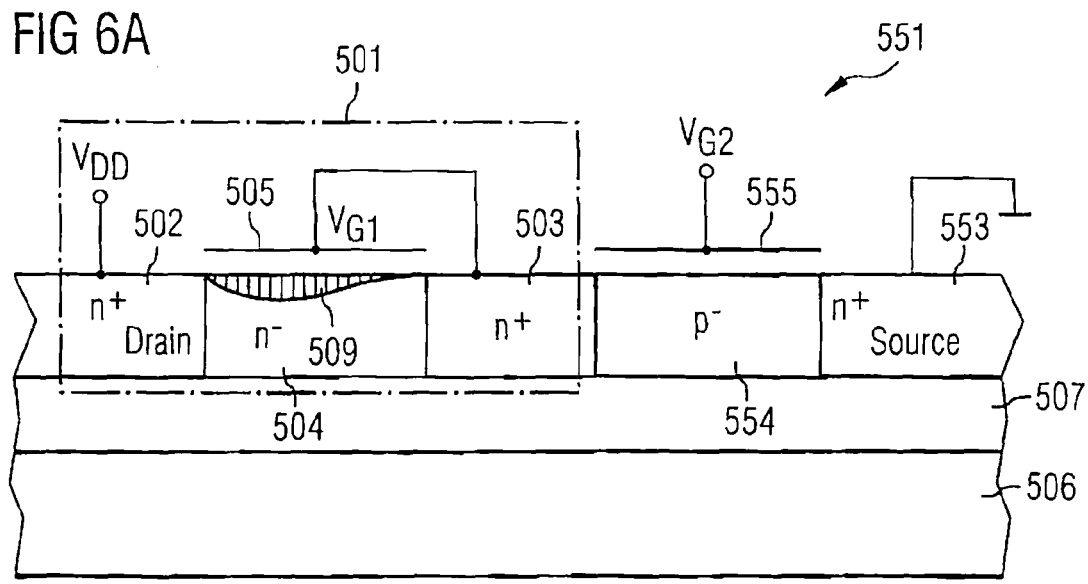
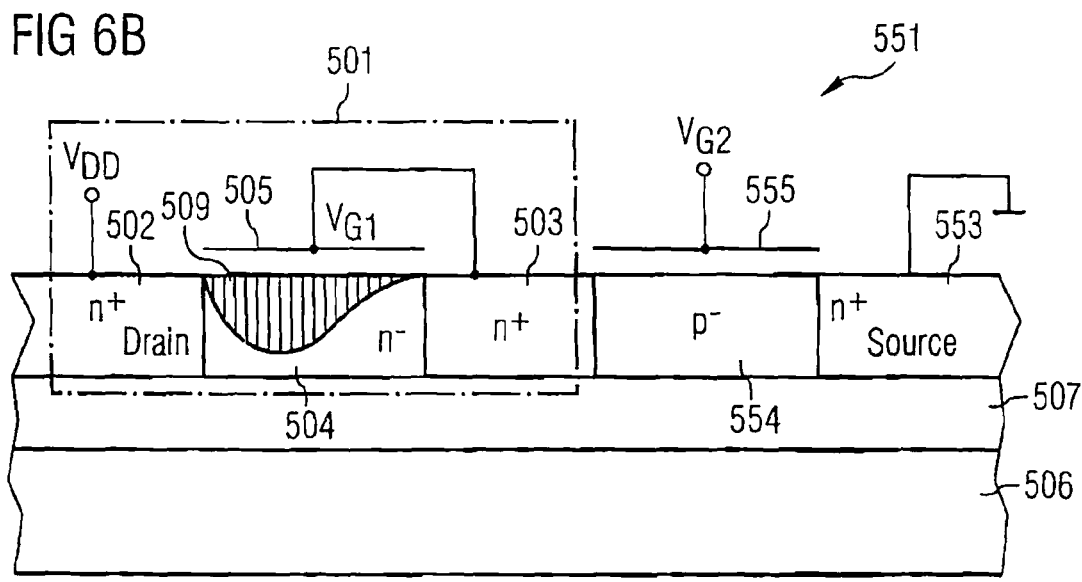

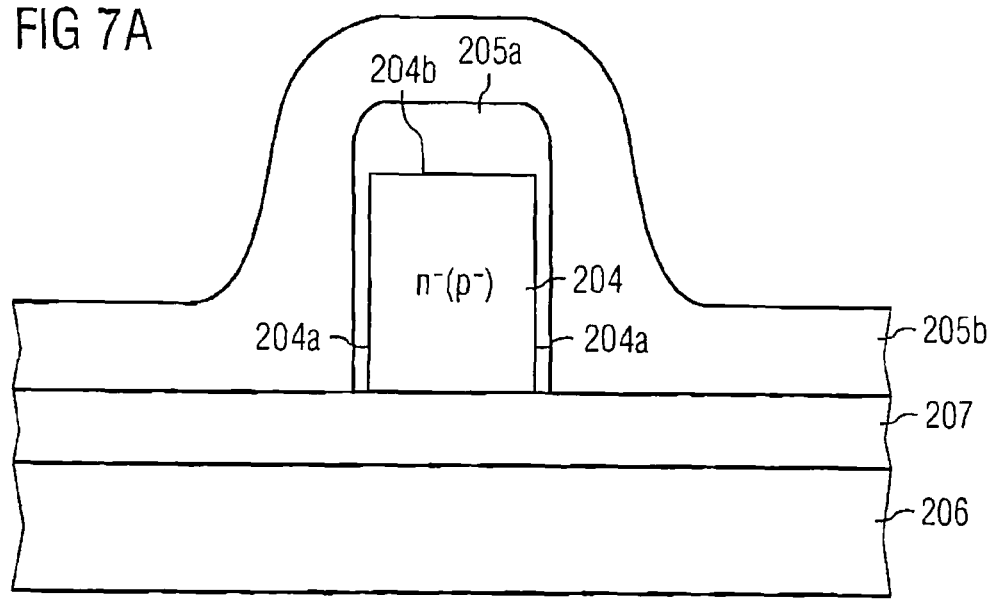
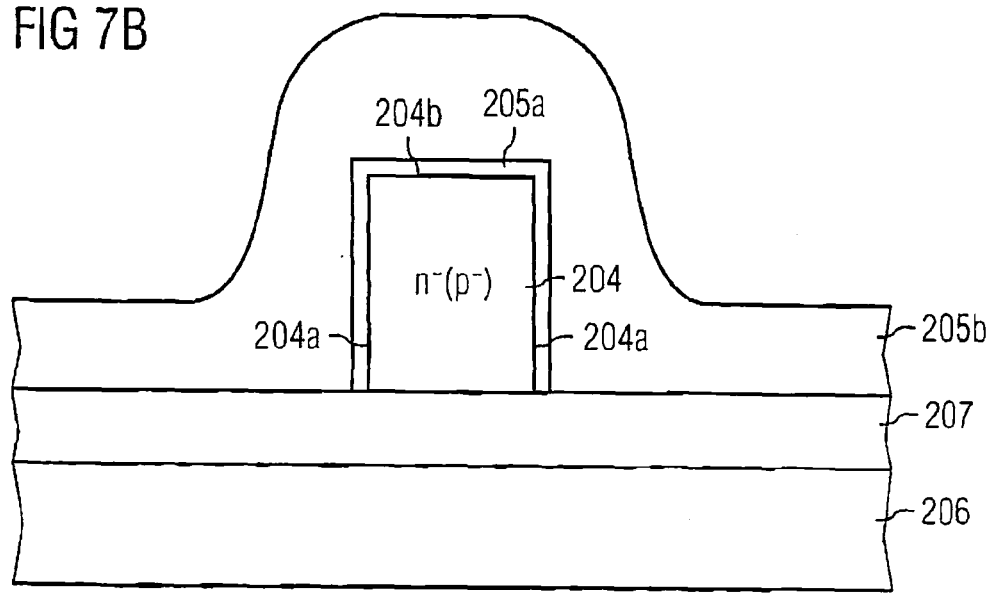

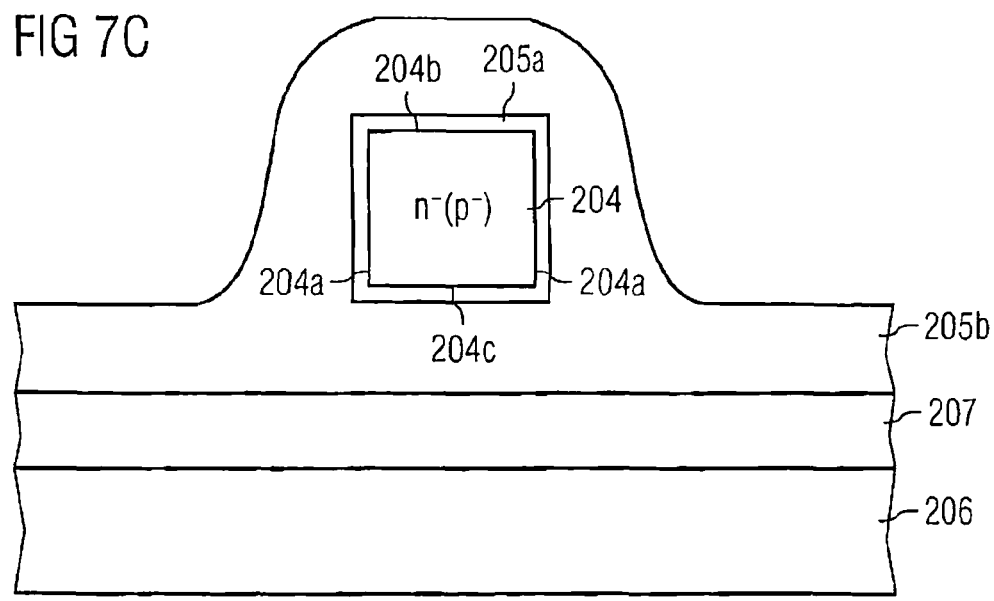
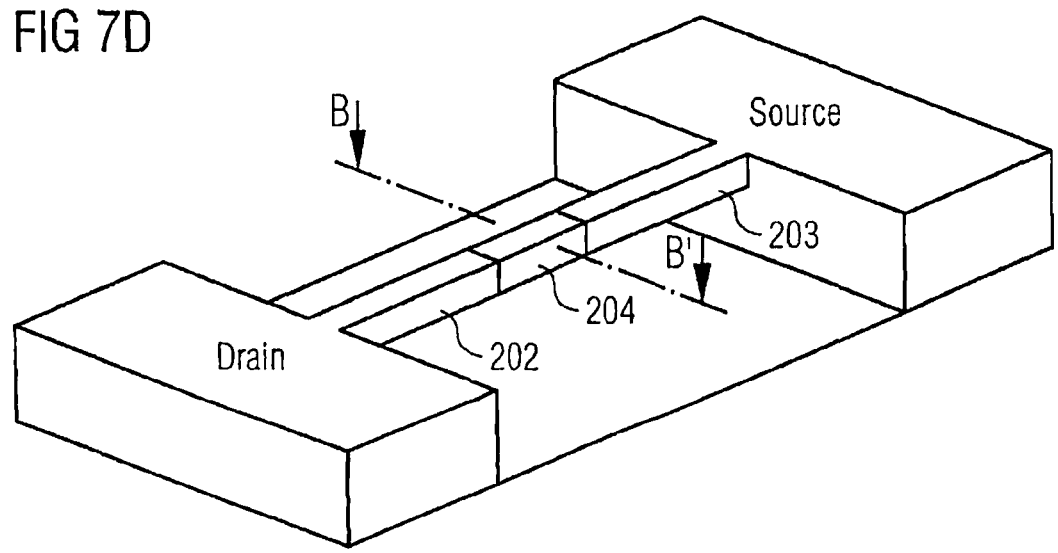

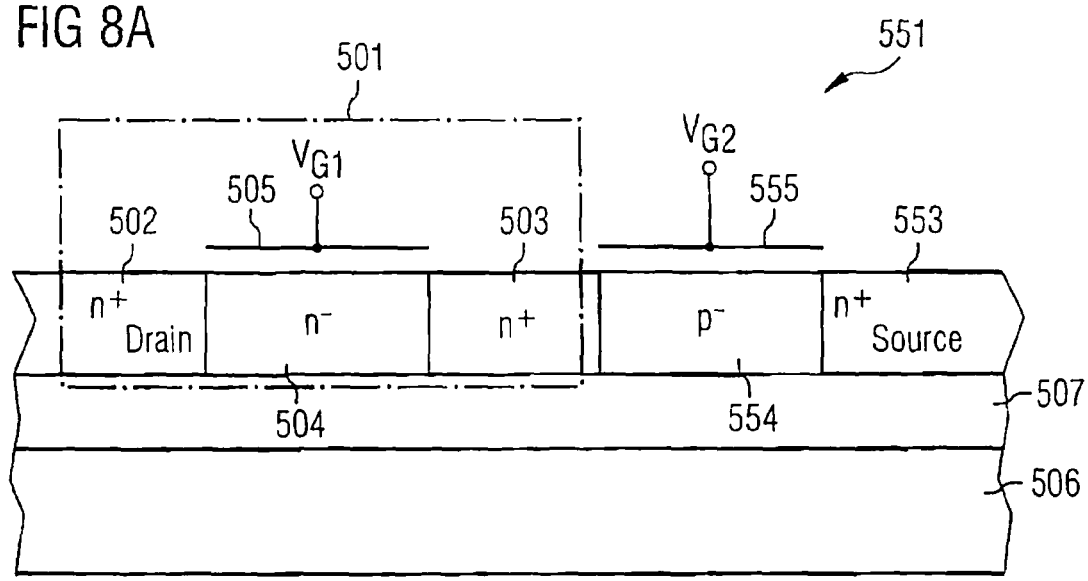
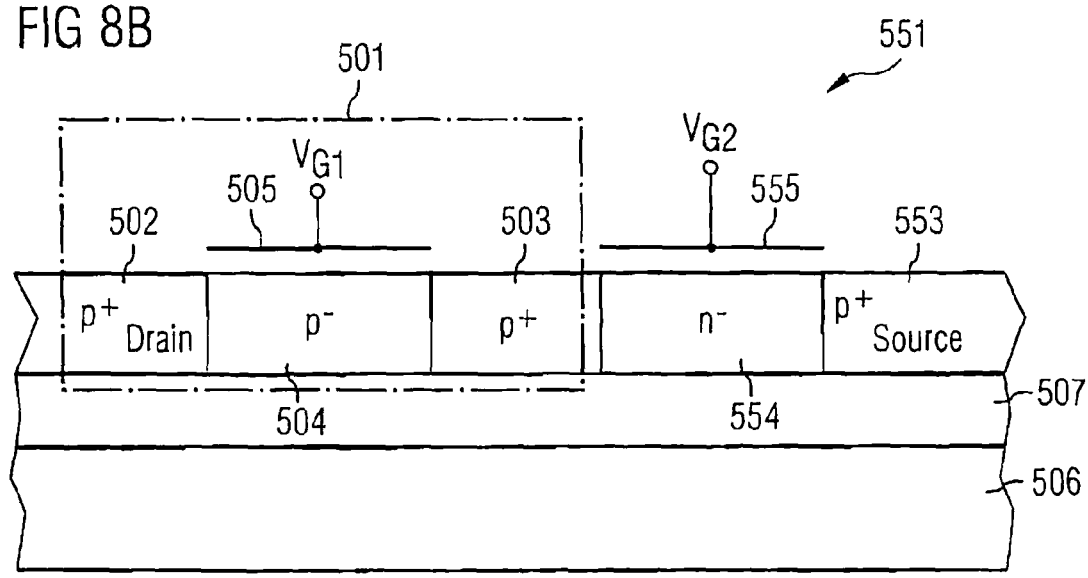

SYSTEM FOR PROTECTION AGAINST ELECTROSTATIC DISCHARGES IN AN ELECTRICAL CIRCUIT

CROSS-REFERENCE TO RELATED APPLICATION

This application is claims priority to U.S. patent application Ser. No. 11/506,683 filed Aug. 18, 2006, which claims priority to German Patent Application No. DE 10 2005 039 365.9-33 filed Aug. 19, 2005.

BACKGROUND

1. Technical Field

The invention relates to a gate controlled fin resistance element for use as electrostatic discharges (ESD) protection element in an electrical circuit, and to a device for protection against electrostatic discharges in an electrical circuit.

2. Description of the Related Art

The development of efficient protection mechanisms for protecting an electronic component against ESD constitutes a growing challenge, particularly when using advanced process technologies such as, for example, MuGFET technologies or FinFET technologies, in view of the ever shrinking dimensions of the electronic devices and the associated increasing sensitivity toward electrical overvoltages.

Electrostatic discharges (ESD) represent a permanent threat to integrated circuits (IC). During an ESD event, short electrical discharge pulses occur during which high electric currents flow or high electrical voltages occur which can damage one or more electronic components of the circuit. Therefore, protection against electrostatic discharges or ESD events is necessary. Multigate field effect transistors (MuG-FET) or fin field effect transistors (FinFET), that is to say field effect transistors having a fin structure, constitute one technological option for further developing CMOS circuits (complementary metal oxide semiconductor) even as far as the 32 nm technology node (32 nm node) and beyond.

FIG. 1A shows a conventional FinFET structure 100, that is to say a field effect transistor having a fin structure. The FinFET structure has a gate 104 "wound" around a freestanding silicon fin 102. Two source/drain regions 103 are formed in the fin 102. If only the two sidewalls of the fin 102 are covered with a thin gate oxide layer and are controlled by the gate 104, this is designated as a FinFET structure or else double gate FinFET structure. If, in addition to the two side areas, further sides of the fin 102 (e.g. upper and/or lower face) are covered with the thin gate oxide layer and are likewise controlled by the gate 104, it is designated as a multigate FET structure (MuGFET structure). If three sides of the fin are controlled by the gate 104, this is also designated as a triple gate structure or a trigate structure. The fin 102 is insulated from a silicon substrate 101 by a buried oxide layer 105 (BOX).

FIG. 1B shows for comparison a conventional planar n conducting FDSOI field effect transistor 150 (Fully Depleted Silicon On Insulator NFET), enclosed in a very thin silicon layer (few nm). The silicon layer is formed on a buried silicon dioxide layer 152, which silicon dioxide layer 152 is in turn formed on a silicon substrate 151. The NFET 150 shown in FIG. 1B has heavily n doped diffusion regions 154, so-called raised source/drain regions 156, a p doped well region 155, a gate region 157 and also isolation regions 153 (Shallow Trench Isolation, STI).

Advantages of multigate field effect transistors or fin field effect transistors are a low leakage current and a small parasitic capacitance, for example, which are comparable with those of FDSOI elements, but in contrast to SOI elements there is no need to form an extremely thin perfect silicon layer on the buried oxide layer. This significantly reduces costs for the substrates.

MuGFETs or FinFETs react extremely sensitively to ESD discharges on account of their small volume exposed to a high power during the discharge. The fin structure results for example in a poor thermal conduction of the devices, which leads to an extremely high intrinsic susceptibility. To express it clearly, during an ESD discharge during which a high current flows through the fin, the poor heat dissipation means that severe heating of the fin structure can occur, which may lead to burn-out of the fin.

The development of effective ESD protection elements in FinFET technologies or MuGFET technologies constitutes a major technological challenge. One problem consists in achieving a uniform distribution of the electric current over the entire width of the transistor in order thereby to minimize the power loss per fin. The possibility of increasing the load resistance (ballasting resistance) of the transistor by means of extending the drain region is restricted, however, by the maximum fin length permitted in the fabrication process. Salicide blocking, as employed in planar technologies, may in turn lead to process problems at the perpendicular sidewalls of the fin.

Many ESD protection elements such as are known from planar bulk technologies can no longer be used in MuGFET technologies or FinFET technologies. By way of example, vertical devices are not available on account of the lacking bulk, and diodes can only be realized as gate-bound lateral diodes. Low voltage thyristors (Low Voltage Silicon Controlled Resistor, LVSCR) also cannot be implemented in a known manner.

In many cases, planar PD devices (partially depleted, that is to say partially depleted of charge carriers) can be integrated together with MuGFETs and FinFETs in one process, thereby making it possible to use the known types of protection elements. One disadvantage of this method, however, is that the breakdown conditions and trigger conditions of planar protection elements and FinFETs (MuGFETs) are not coordinated with one another, which leads to inadequate protection against ESD events. A further disadvantage of this method is that the use of a second device type that differs greatly compared with the standard driver transistor may lead to an increase in the process complexity.

In order to achieve a uniform current conduction in the individual fins themselves, there is the possibility of connecting small polysilicon resistors in series. However, one disadvantage of this method is that the area requirement of the transistor is thereby significantly increased.

BRIEF SUMMARY

One embodiment of the invention provides a gate controlled fin resistance element for use as ESD protection element in an electrical circuit. The gate controlled fin resistance element has a fin structure having a first connection region, a second connection region and a channel region formed between the first connection region and the second connection region. Furthermore, the gate controlled fin resistance element has a gate region formed at least over a part of the surface of the channel region, and also a gate control device, which is electrically coupled to the gate region and which controls an electrical potential applied to the gate region in such a way that the gate controlled fin resistance element has a high electrical resistance during a first operating state of the electrical circuit, and that the gate controlled fin resistance element has a lower electrical resistance during a second operating state of the electrical circuit, said second operating state being characterized by the occurrence of an ESD event.

Another embodiment of the invention provides a device for protection against electrostatic discharges in an electrical circuit, having at least one gate controlled fin resistance element described above, which is connected in parallel with at least one element of the electrical circuit that is to be protected against an ESD event.

Another embodiment of the invention provides a gate controlled fin resistance element for use as ESD protection element in an electrical circuit, which gate controlled fin resistance element has a fin structure having a first connection region, a second connection region and also a channel region formed between the first connection region and the second connection region. Furthermore, the gate controlled fin resistance element has a gate region formed at least over a part of the surface of the channel region, the gate region being electrically coupled to the second connection region, so that the gate controlled fin resistance element has a low electrical resistance during a first operating state of the electrical circuit, and that the gate controlled fin resistance element has a higher electrical resistance during a second operating state of the electrical circuit, said second operating state being characterized by the occurrence of an ESD event.

Another embodiment of the invention provides a device for protection against electrostatic discharges in an electrical circuit, which device has at least one gate controlled fin resistance element described above, which is connected in series with at least one element of the electrical circuit that is to be protected against an ESD event.

The expressions fin structure or fin are used synonymously hereinafter. A fin structure or fin is understood to mean a ridge structure or a bridge structure which is formed or freely suspended on a substrate. A fin resistance element is understood to mean an electrical resistance element having a fin structure. A fin field effect transistor (FinFET) is understood to mean a field effect transistor having a fin structure. A multigate field effect transistor (MuGFET) is understood to mean a fin field effect transistor (FinFET), which FinFET is driven from more than two sides. A MuGFET driven from three sides is also referred to as a triple gate field effect transistor or as a trigate field effect transistor. A FinJFET structure or a FinJFET is understood to mean a junction field effect transistor having a fin structure. A MuGJFET structure or a MUGJFET is understood to mean a FinJFET which is driven from more than two sides.

One embodiment of the invention provides an ESD protection element which is based on a fin technology and which has, on account of a homogeneous current distribution and a favorable current-voltage characteristic (I-V characteristic), a high ESD robustness per width, thereby enabling a low clamping voltage.

In accordance with another embodiment of the invention, the ESD protection element is based on a gate controlled fin resistance element, which gate controlled fin resistance element has a fin structure. One advantage of a gate controlled fin resistance element having a fin structure may be seen in the fact that the gate controlled fin resistance element can be integrated in a FinFET process or MuGFET process as ESD protection element.

In accordance with another embodiment of the invention, the gate controlled fin resistance element is based on a fin junction field effect transistor (FinJFET) having a gate region (control gate), which gate region is formed at least over a part of the surface of the channel region and with the aid of which the electrical resistance of the gate controlled fin resistance element or FinJFET is influenced. In the case of an approximately parallelepidal fin structure or fin, the gate region may be formed for example over one, two, three or all four side areas of the channel region. In other words, the channel region can be driven from up to four sides with the aid of the control gate or gate region.

The FinJFET is in an electrically conducting state if no external voltage (operating voltage or supply voltage) is present ("normally on" transistor), which is the case for example during a typical ESD event. If the integrated electrical circuit (integrated circuit, IC) in which the gate controlled fin resistance element or FinJFET is formed is supplied with voltage, however, the FinJFET is turned off.

In other words, the gate controlled fin resistance element or the fin junction field effect transistor (FinJFET) acquires high resistance, that is to say it has a high electrical resistance or is high-ohmic, if the IC is supplied with an external voltage. The state in which a supply voltage is applied to the circuit corresponds to a normal operating state of the electrical circuit, also called first operating state hereinafter.

As a result of the transistor being turned off in normal operation, that is to say in the case of voltage supply (also called "powered" state), a minimization of the leakage current via the ESD protection structure is achieved, by way of example.

In a second operating state of the electrical circuit, in which the electrical circuit is not supplied with an external voltage (also called "non-powered" state), however, the gate controlled fin resistance element (FinJFET) has a lower electrical resistance. In other words, the gate controlled fin resistance element or the FinJFET acquires low resistance (low-ohmic) or is open in this case. The second operating state of the electrical circuit, in which the circuit is not supplied with a voltage externally, is typically present when an ESD event occurs.

In other words, the second operating state of the electrical circuit is characterized by the occurrence of an ESD event. Since the FinJFET or the gate controlled fin resistance element acquires low resistance or is open in the second operating state, an ESD pulse can be optimally dissipated via the FinJFET or the gate controlled fin resistance element.

The changeover between the high-resistance state and the low-resistance state of the gate controlled fin resistance element is effected with the aid of a gate control device, also called gate control circuit or control circuit, which is electrically coupled to the gate region of the gate controlled fin resistance element or FinJFET. With the aid of the gate control device, an electrical potential applied to the gate region is controlled in such a way that the gate controlled fin resistance element (FinJFET) has a high electrical resistance in the first operating state, in which the electrical circuit (IC) is supplied with an external operating voltage, while the FinJFET has a lower electrical resistance in the second operating state (characterized by the occurrence of an ESD event), in which the electrical circuit is not supplied with a voltage.

In accordance with another embodiment of the invention, both the connection regions and the channel region of the gate controlled fin resistance element are doped, in which case, on the one hand, the doping is of identical type, that is to say that both the connection regions and the channel region are either n doped or p doped, and in which case, on the other hand, the channel region has a lower doping intensity or dopant concentration than the connection regions. An improved control effect can be achieved as a result of the lower doping intensity of the channel region.

In accordance with another embodiment of the invention, the connection regions are heavily n doped, while the channel region is weakly n doped (n−).

Analogously, in accordance with another embodiment of the invention, the connection regions may be heavily p doped (p+), while the channel region is weakly p doped (p−).

In accordance with another embodiment of the invention, with the aid of the gate control device, the gate region (gate) of a fin is controlled in such a way that the weakly doped channel region is pinched off below the gate (also referred to as pinch-off), while the electrical circuit or IC is supplied with a voltage, that is to say during the first operating state of the electrical circuit.

By way of example, for the case of a n+/n−/n+ fin, that is to say a fin structure having a heavily n doped first connection region (also called drain region), a second heavily n doped connection region (also called source region) and a weakly n doped channel region formed between the connection regions, the weakly n doped channel region may be pinched off with the aid of the gate control device. Analogously to this, in the case of a p+/p−/p+ fin structure, the weakly p doped channel region may be pinched off with the aid of the gate control device during the first operating state.

In the case of an n-FinJFET, that is to say a FinJFET having n doped connection regions and an n doped channel region, the pinch-off of the channel region may be achieved for example by virtue of the fact that during the first operating state, in which the electrical circuit is supplied with voltage, the electrical potential (also called gate bias) that is applied to the gate region and is controlled with the aid of the gate control device leads to an extended space charge zone in the channel region, as a result of which the n-FinJFET or the gate controlled fin resistance element is switched off or acquires high resistance. In this case, the control device may be set up in such a way that the electrical potential applied to the gate region is much lower than an electrical potential present at the drain region, that is to say the first connection region. In other words, as soon as the IC is supplied with voltage, it is possible, with the aid of the gate control device or the control circuit, to constrain a much lower electrical potential in comparison with the drain potential at the gate region (gate) of the fin resistance element, which potential leads to a depletion of charge carriers in the channel region of the fin resistance element (FinJFET). As a result, the fin junction field effect transistor can be switched off.

The pinch-off of the channel region during the first operating state has the effect that only a very low or no electric current at all can flow through the channel region, that is to say that the FinJFET has a very high electrical resistance in the first operating state.

In the second operating state of the electrical circuit, in which no external electrical supply voltage is present, the channel region is not pinched off and can flow with the drain region or drain of the fin structure. In other words, a drain current, that is to say an electric current between drain region and source region, can flow through the channel region of the fin resistance element. In this case, the fin resistance element behaves like an electrical resistance element having a low electrical resistance. In this low-resistance state, the fin resistance element has a favorable current-voltage characteristic (I-V characteristic), with an I-V branch that rises steeply even at low voltages. It is thereby possible to achieve a good clamping voltage behavior (voltage clamping), which is important in order to be able to reliably protect the sensitive gate oxides during an ESD event, by way of example.

In the case of the n-FinJFET mentioned above, the pinch-off of the channel region during the second operating state, that is to say in the case of an ESD event, can be prevented by keeping the electrical potential applied to the gate region close to the drain potential, that is to say the electrical potential of the drain region, with the aid of the gate control device, thereby reducing the extent of the space charge zone in the channel region. As a result, the fin resistance element or the FinJFET acquires low resistance.

When the gate controlled fin resistance element is used as ESD protection element, the maximum voltage present at the gate region or gate is to be limited in order to prevent an inversion layer from arising and in order to reduce the leakage current.

Another embodiment of the invention provides a controllable resistance element having a fin structure, which resistance element can be used in an arbitrary electrical circuit as ESD protection element. The controllable resistance element operates as a so-called pinch resistor, in which the channel region is pinched off by an extended space charge zone in a (normal) first operating state of the electrical circuit and the resistance element is thus at high resistance. In the case of an ESD event, however, the extent of the space charge zone is greatly reduced, and the resistance element acquires low resistance. In this case, the extent of the space charge zone is controlled with the aid of the gate control device, which correspondingly controls an electrical potential applied to the gate region. An improved control effect can be obtained in this case on account of the fin geometry of the resistance element.

In order to achieve an optimum control of the gate controlled fin resistance element, in accordance with one embodiment of the invention, the connection regions and the channel region are doped with an identical type of doping, and the channel region has a lower doping intensity or dopant concentration than the connection regions.

In accordance with another embodiment of the invention, the connection regions and the channel region have the same doping intensity.

In accordance with another embodiment of the invention the channel region is formed as a region having intrinsic conductivity. In this case, the fin resistance element has a lower leakage current but also a lower ESD current.

In accordance with another embodiment of the invention, in a device for protection against electrostatic discharges (ESD events) in an electrical circuit, a plurality of gate controlled fin resistance elements are connected in parallel with at least one element of the electrical circuit that is to be protected against an ESD event.

In accordance with another embodiment of the invention, the plurality of gate controlled fin resistance elements connected in parallel have a common gate region. The fin resistance elements connected in parallel can thus be controlled simultaneously by means of an electrical potential that is applied to the common gate region and is controlled by the gate control device. In the first operating state of the electrical circuit, the electrical potential applied to the common gate region can then be controlled with the aid of the gate control device in such a way that all the fin resistance elements are switched off, that is to say have a high electrical resistance. Consequently, no electric current flows through the fin resistance elements in the first operating state. In the case of an ESD event, however, the electrical potential applied to the common gate region can be altered with the aid of the gate control device in such a way that all the fin resistance elements acquire a low resistance and can thus dissipate the ESD current. To put it clearly, the fin resistance elements thus act as "lightening arrestors".

In accordance with another embodiment of the invention, a gate controlled fin resistance element is formed as a serial ballast resistor in each fin of a transistor (e.g. input/output driving stage) by virtue of a depletion zone being formed in the drain region or the source region of the fin transistor, whereby it is possible to ensure both a uniform current flow under ESD conditions (second operating state) and a low electrical resistance in a normal (first operating state).

In accordance with another embodiment of the invention, in each fin of a FinFET transistor, a gate controlled resistor or a gate controlled fin resistance element is connected in series with the MOS transistor to be protected. The gate or the gate region of the gate controlled fin resistance element is electrically coupled to the second connection region of the gate controlled fin resistance element. In this case, the second connection region of the gate controlled fin resistance element is also referred to as second drain region, while the first connection region of the gate controlled fin resistance element is referred to as first drain region.

Since the gate region and the second drain region are electrically coupled to one another, the electrical potential present at the gate region (gate potential) is equal to the electrical potential of the second connection region or of the second drain region. In the case of a low current flow, the latter potential is in turn approximately equal to the electrical potential of the first connection region or of the first drain region, since only a small voltage drop occurs between the first drain region and the second drain region.

In the case of low current flow, therefore, no significant depletion of electrical charge carriers occurs in the channel region, that is to say that the channel region has only a very small space charge zone. The fin resistance element therefore has a low serial resistance, which is advantageous for a transistor to be protected (e.g. driver transistor).

As soon as the current level (current flow) rises significantly, however, as is the case during an ESD discharge, a significant voltage drop occurs between the first drain region and the second drain region. As a consequence of this, the gate potential has a negative bias relative to the potential of the first drain region. To put it another way, the gate region has a significantly lower electrical potential than the first drain region. As a result, a great depletion of electrical charge carriers occurs in the channel region of the fin resistance element. In other words, an extended space charge zone forms in the channel region, as a result of which the resistance of the fin resistance element rises significantly. To put it in yet another way, the fin resistance element has a significantly higher electrical resistance in a second operating state, which is characterized by the occurrence of an ESD event than in the first operating state.

As soon as a depletion zone has formed in the channel region, it brings about an even higher voltage drop between the first drain region and the second drain region, as a result of which the depletion zone in turn extends even further. This negative feedback loop stabilizes the current flow and ensures a homogeneous distribution of the current constrained by the ESD discharge between the multi-fins, that is to say the individual fin structures of a transistor to be protected (e.g. driver transistor).

An advantage of one embodiment of the invention consists in avoiding an additional process step for salicide blocking which process step is required in the implementation of a conventional nonreactive series resistance in the drain path of the transistor. The fact that a salicide blocking is not necessary means that the process costs can be reduced and the yield can be increased on account of the reduced process complexity.

In accordance with another embodiment of the invention, the gate controlled fin resistance element, in which the gate region is electrically coupled to the second connection region, additionally has a gate control device, which is electrically coupled to the gate region and with the aid of which (1) the electrical resistance of the gate controlled fin resistance element is reduced further during the first operating state of the electrical circuit and/or (2) the rise in the electrical resistance is amplified during the second operating state of the electrical circuit.

With the aid of the additional gate control device (control circuit), it is possible to provide a predetermined low electrical potential at the gate region while the electrical circuit or IC is supplied with voltage, that is to say during the first operating state of the electrical circuit. It is thereby possible to further reduce the resistance Ron of the fin resistance element during the first operating state. Furthermore, with the aid of the gate control device, it is possible to intensify the depletion of electrical charge carriers in the channel region if an ESD event is detected. It is thereby possible to amplify the rise in the electrical resistance in the case of an ESD event.

In accordance with another embodiment of the invention, in a device for protection against electrostatic discharges in an electrical circuit, a plurality of gate controlled fin resistance elements in which the gate region is coupled to the second connection region or the second drain region and optionally to a gate control device are connected in series with one or more elements of the electrical circuit that is or are to be protected against an ESD event and act as ballast resistors. By way of example, an element of the electrical circuit or IC that is to be protected may be a driver transistor, which driver transistor is formed as a FinFET having a multiplicity of individual fins. In this case, the device for protection against electrostatic discharges may be set up in such a way that in each fin of the driver transistor, a gate controlled fin resistance element is connected in series as a ballast resistor.

During the first operating state of the electrical circuit, the fin resistance elements connected in series have a low electrical resistance and, as a result, do not impede the current flow through the individual fins of the transistor. In the case of an ESD event (second operating state of the electrical circuit) and an associated current rise, however, the channel regions of the individual gate controlled fin resistance elements are pinched off on account of the electrical coupling of the gate region to the second drain region and the resultant negative feedback, with the result that said resistance elements acquire high resistance and have a significantly higher resistance than during the normal (first) operating state. The negative feedback that occurs in the case of a current rise in each fin ensures a homogeneous current distribution between all the fins, so that the ESD robustness of the driver transistor is increased.

In accordance with another embodiment of the invention, the individual gate controlled fin resistance elements connected in series have a common gate region. In this case, an electrical potential present at the common gate region can be controlled with the aid of the gate control device, so that, by way of example, during the first operating state of the electrical circuit, the resistor Ron of each individual gate controlled fin resistance element can be simultaneously reduced further with a single gate control device. It is likewise possible, in the case of an ESD event, by means of the one gate control device, to simultaneously amplify the rise in the electrical resistance in all the gate controlled fin resistance elements.

The embodiments of the gate controlled fin resistance element that have been described above with regard to the doping of the connection regions and the channel region also apply to the gate controlled fin resistance element in which the gate region is electrically coupled to the second connection region.

In accordance with another embodiment of the invention, in the gate controlled fin resistance element in which the gate region is electrically coupled to the second connection region, the channel region may have a plurality of first partial regions and a plurality of second partial regions, which first partial regions and second partial regions form an alternate sequence. For the case where the connection regions are n doped, the first partial regions are p doped or have an intrinsic conductivity, and the second partial regions are n doped. For the case where the connection regions are p doped, the first partial regions are n doped or have an intrinsic conductivity, and the second partial regions are p doped. In both cases, the number of first partial regions is greater than the number of second partial regions.

The first partial regions and second partial regions are formed alternately alongside one another. Since the first partial regions and the second partial regions form an alternate sequence, and since the number of first partial regions is greater than the number of second partial regions, the channel region is clearly delimited at its two outer ends by a first partial region in each case.

Unless noted otherwise, the following exemplary embodiments of the invention relate both to the gate controlled fin resistance element without mutual electrical coupling of gate region and second connection region and to the gate controlled fin resistance element with mutual coupling of gate region and second connection region.

In accordance with another embodiment of the invention, the gate region has an electrically conductive gate layer, which electrically conductive gate layer is formed at least on a part of the surface of the channel region.

In accordance with another embodiment of the invention, the gate region has a gate insulating layer and a conductive gate layer, the gate insulating layer being formed at least on a part of the surface of the channel region, and the electrically conductive gate layer being formed at least on the gate insulating layer.

The electrically conductive gate layer may comprise one of the following materials: titanium nitride, silicide, carbon, polysilicon or a metallic compound with a suitable work function. For the case where the electrically conductive gate layer comprises polysilicon material, the polysilicon material may be p doped in order to increase the conductivity of the polysilicon.

In accordance with another embodiment of the invention, the gate insulating layer comprises silicon dioxide ($SiO_2$) or a material having a high dielectric constant (high-k dielectric). The gate insulating layer may have a thickness of at least 2 nm.

In accordance with another embodiment of the invention, the first connection region and/or the second connection region and/or the channel region of the gate controlled fin resistance element comprise/comprises silicon material. In other words, the fin structure may be based on a silicon technology.

In accordance with another embodiment of the invention, the fin structure has a length of between 10 nm and 10 □m, a width of between 5 nm and 50 nm, and a height of between 5 nm and 200 nm.

In accordance with another embodiment of the invention, the first connection region of the gate controlled fin resistance element is electrically coupled to an electrical supply voltage source, which provides a predetermined supply potential.

In accordance with another embodiment of the invention, in a gate controlled fin resistance element in which the gate region is electrically coupled to the second connection region, and in which the channel region has first and second partial regions, the gate region is formed at least over the first partial regions of the channel region.

In accordance with another embodiment of the invention, a device for protection against electrostatic discharges in an electrical circuit has a substrate and also an electrically insulating layer formed on the substrate, the device being formed on the electrically insulating layer.

In accordance with another embodiment of the invention, the substrate is formed as a silicon substrate, and the electrically insulating layer is formed as an oxide layer, for example as a silicon dioxide layer.

One advantage of exemplary embodiments of the invention may be seen in the fact that provision is made of ESD protection mechanisms or ESD protection elements for a MuGFET process or FinFET process which is based on a gate controlled fin resistance element. In this case, a distinction may essentially be made between two variants of the gate controlled fin resistance element.

In accordance with a first variant, a junction field effect transistor based on fin technology (FinJFET) may be used as gate controlled fin resistance element, said transistor having a gate region (control gate) formed for example over two or more sides of a fin. In this case, the silicon layer below the gate, i.e. the channel region, has either a virtually intrinsic conductivity or is doped by a type of doping identical to that of the two connection regions (source and drain region). The gate is controlled in such a way that, in a first (normal) operating state of a circuit, a depletion of electrical charge carriers occurs in the channel region, as a result of which the FinJFET is switched into a high-resistance state (pinch-off). During an ESD event (second operating state), in which the circuit is not supplied with a voltage, the gate potential follows the drain potential and the charge carrier depletion is reduced.

In a device for protection against electrostatic discharges in a circuit in accordance with another embodiment of the invention, one or more FinJFETs is or are connected in parallel with one or more elements of a circuit that is or are to be protected. During a normal operating state, the FinJFETs connected in parallel are at high resistance and no current or only a very small current flows through the FinJFETs. During an ESD event, the FinJFETs are at low resistance and effectively dissipate the high ESD current, so that the circuit elements to be protected are not damaged.

In accordance with a second variant, a gate controlled fin resistance element may be formed as a serial ballast resistor in a fin of an element to be protected (e.g. driver transistor). In this case, the ballast resistor results from a depletion zone which is formed in the drain region or source region of the transistor and the extent of which is controlled e.g. by a gate formed over two or more sides of the fin. In contrast to the first variant described, the ballast resistor is at low resistance during a normal (first) operating state, in which a low current flows. As the current rises (e.g. as a consequence of an ESD event), the extent of the depletion zone is enlarged by the control gate, as a result of which the electrical resistance likewise rises. The fin resistance element thus acquires high resistance, and the electrical coupling of the gate region to the second connection region effects a negative feedback in such a way that the electrical resistance rises even further.

In a device for protection against electrostatic discharges in accordance with another embodiment of the invention, a ballast resistor is connected in series in each fin of a transistor to be protected (e.g. driver transistor). During a normal operating state, the ballast resistors connected in series are at low resistance and therefore have only an insignificant influence on the current flow through the individual fins. During an ESD event, the ballast resistors acquire high resistance and a homogeneous current distribution between all the fins is ensured by the negative feedback that occurs in the case of a current rise in each fin, with the result that the (intrinsic) ESD robustness of the driver transistor is increased.

An advantage of one embodiment of the invention may be seen in the fact that an element is provided which enables an effective protection of fin field effect transistors or multigate field effect transistors against electrostatic discharges and at the same time at least partially avoids or reduces problems or disadvantages of conventional protection elements.

BRIEF DESCRIPTION OF THE DRAWINGS

FIG. 3A illustrates a schematic illustration of the space charge zone in the channel region of the gate controlled fin resistance element from FIG. 2B during a first operating state of the electrical circuit;

FIG. 3B illustrates a schematic illustration of the space charge zone in the channel region of the gate controlled fin resistance element from FIG. 2B during a second operating state of the electrical circuit;

FIG. 5B illustrates a cross-sectional view of one of the two gate controlled fin resistance elements from FIG. 5A along the broken line in FIG. 5A;

FIG. 5C illustrates the cross-sectional view from FIG. 5B with an additional gate control device in accordance with another exemplary embodiment of the invention;

FIG. 6A illustrates a schematic illustration of the space charge zone in the channel region of the gate controlled fin resistance element from FIG. 5B during a first operating state of the electrical circuit;

FIG. 6B illustrates a schematic illustration of the space charge zone in the channel region of the gate controlled fin resistance element from FIG. 5B during a second operating state of the electrical circuit;

FIG. 7A illustrates a longitudinal cross section through the gate region of a gate controlled fin resistance element formed as a fin junction field effect transistor in accordance with another exemplary embodiment of the invention;

FIG. 7B illustrates a longitudinal cross section through the gate region of a gate controlled fin resistance element formed as a fin junction field effect transistor in accordance with another exemplary embodiment of the invention;

FIG. 7C illustrates a cross-sectional view along the broken line in FIG. 7D after the formation of a gate region;

FIG. 7D illustrates a silicon-on-nothing structure with a freely suspended silicon bridge prior to the formation of a gate region;

FIG. 8A illustrates a cross-sectional view of a gate controlled fin resistance element formed as a ballast resistor in accordance with another exemplary embodiment of the invention;

FIG. 8B illustrates a cross-sectional view of a gate controlled fin resistance element formed as a ballast resistor in accordance with another exemplary embodiment of the invention;

DETAILED DESCRIPTION

Figure 1A:
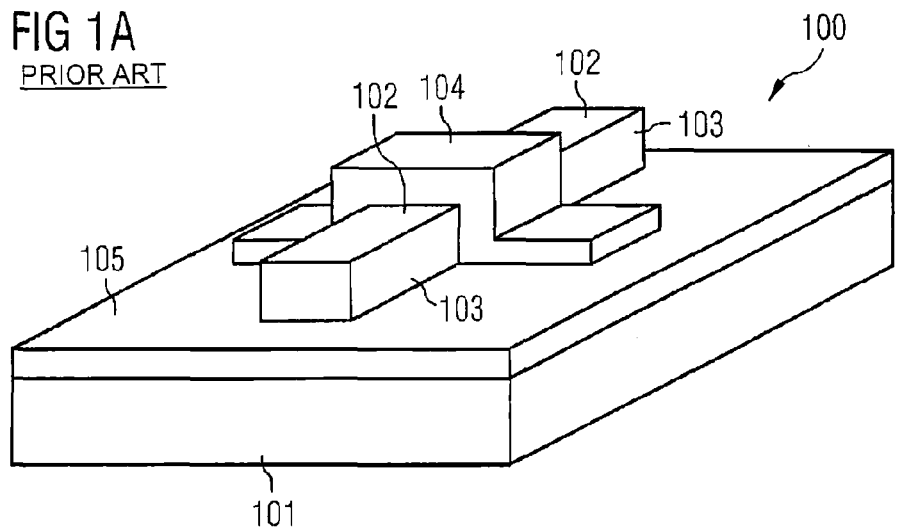
FIG. 1A illustrates the construction of a conventional fin or multigate field effect transistor.
Figure 1B:
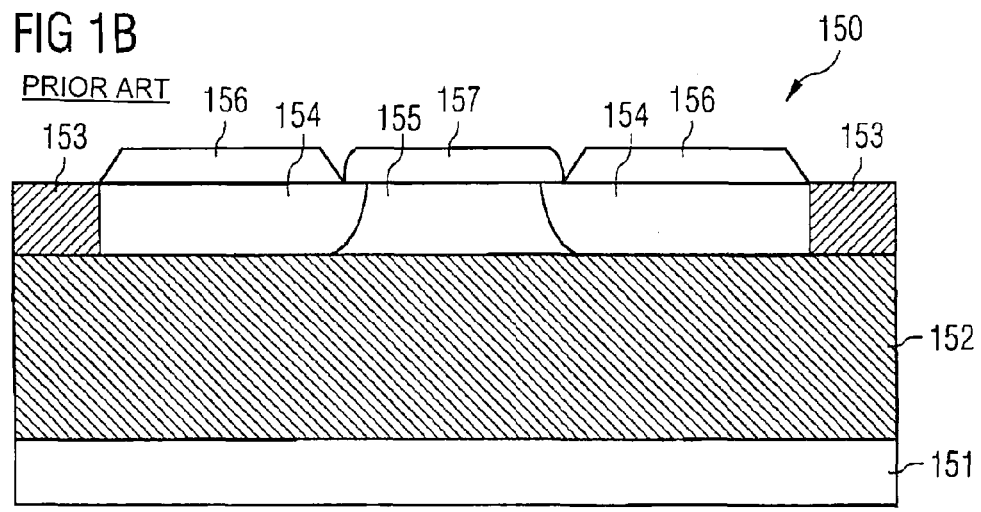
FIG. 1B illustrates the construction of a conventional planar n-conducting fully depleted silicon-on-insulator field effect transistor.
Figure 2A:
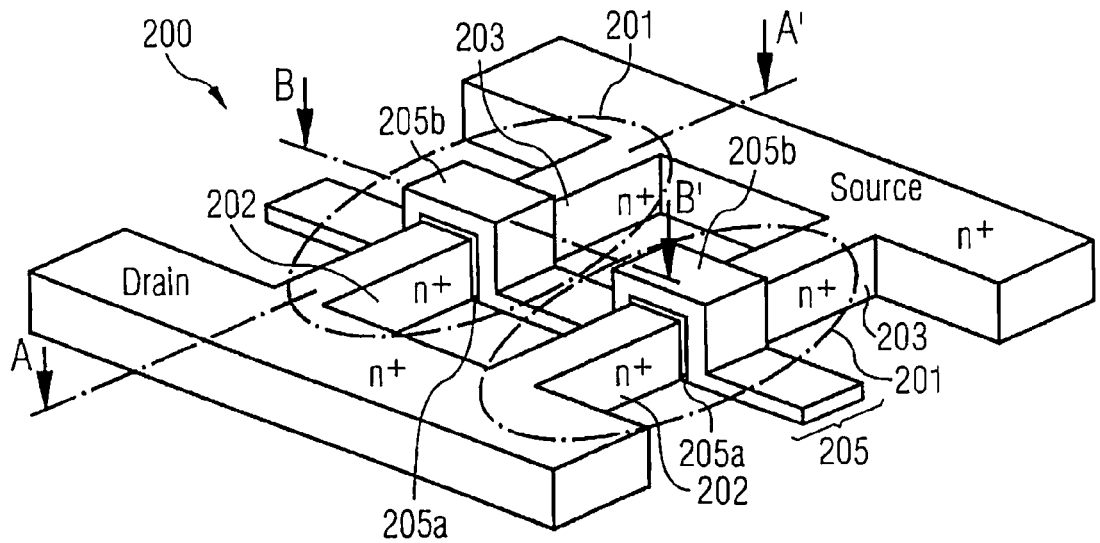
FIG. 2A illustrates a device for protection against electrostatic discharges in an electrical circuit with two gate controlled fin resistance elements formed as fin junction field effect transistors (FinJFET) in accordance with one exemplary embodiment of the invention.

FIG. 2A shows a device 200 for protection against electrostatic discharges in an electrical circuit with two gate controlled fin resistance elements 201 formed as fin junction field effect transistors (FinJFET) in accordance with one exemplary embodiment of the invention. The gate controlled fin resistance elements 201 have a fin structure, having in each case a heavily n doped (n+ doped) first connection region 202, a heavily n doped (n+ doped) second connection region 203 and also a weakly n doped (n– doped) channel region 204 formed between the first connection region 202 and the second connection region 203, the channel region 204 being concealed by a gate region or gate 205 formed over the side areas and the upper face of the channel region 204, cf. FIG. 2B.

The fin structures of the gate controlled fin resistance elements 201 have for example a length of between 10 nm and 10 µm, and a width of between 5 nm and 50 nm, and a height of between 5 nm and 200 nm.

The two FinJFETs 201 of the device 200 are connected in parallel with one another, and the gate region or the gate 205 is formed as a common gate region or common gate 205, a thin gate insulating layer 205a made of silicon dioxide in each case being formed on a part of the channel region 204 of each FinJFET 201. To put it more precisely, the gate insulating layer 205a is formed on the side areas and on the upper face of the channel region 204 of each FinJFET. The gate insulating oxide layer 205a may have a thickness of approximately 2 nm.

In an alternative embodiment of the invention, the gate insulating layer 205a may be dispensed with in the case of a gate controlled fin resistance element 201.

Figure 2B:
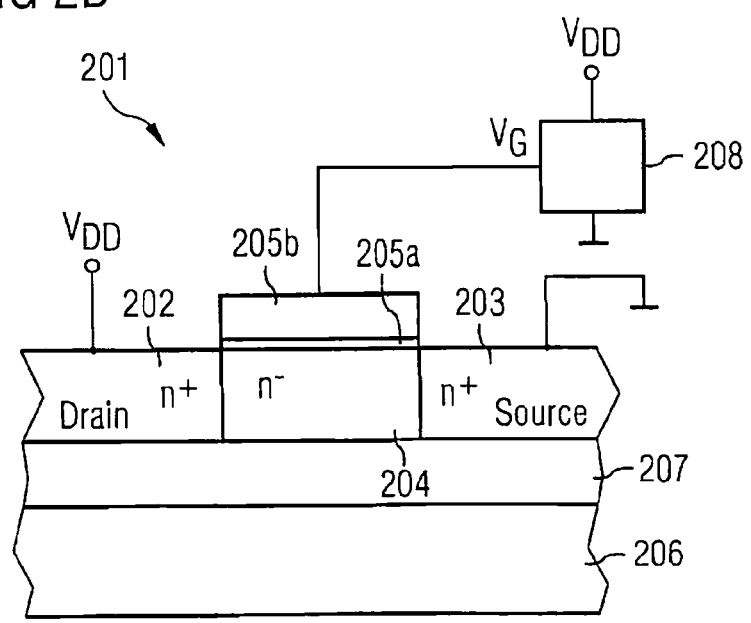
FIG. 2B illustrates a cross-sectional view of one of the two gate controlled fin resistance elements from FIG. 2A along the broken line in FIG. 2A.

FIG. 2A furthermore shows that a conductive gate layer 205b made of p doped polysilicon is formed on the gate insulating layer 205a of each FinJFET 201 and also on an electrically insulating silicon dioxide layer 207 formed on a silicon substrate 206 (cf. FIG. 2B).

The two gate controlled fin resistance elements 201 formed as FinJFET (and optionally also even further FinJFETs connected in parallel (not shown)) can be driven jointly with the aid of the common gate region 205. In each FinJFET, the thin gate insulating oxide layer 205a is formed on the two side areas and the upper face of the channel region 204 of the fin structures 201, so that the channel region 204 can be driven from three sides with the aid of the gate region 205. Therefore, the fin structures 201 shown in FIG. 2A are triple gate structures.

As mentioned above, in the case of a gate controlled fin resistance element 201, the gate insulating layer 205a can be dispensed with, and the conductive gate layer 205b can be formed directly on a part of the surface of the channel region 204. For this case, the mode of operation of the gate controlled fin resistance element 201 corresponds to that of a traditional junction field effect transistor (JFET).

The device 200 may be formed in an electrical circuit or an IC in such a way that the two gate controlled fin resistance elements 201 formed as FinJFET (and possibly further FinJFETs (not shown)) are connected in parallel with one or more elements of the electrical circuit or IC that is or are to be protected against an ESD event. The element to be protected is for example a field effect driver transistor based on fin technology and having a plurality of transistor fingers or fins. In this case, the gate controlled fin resistance elements 201 are connected in parallel with the fins of the driver transistor, so that, during an ESD event, that is to say an electrostatic discharge, the high ESD current can be optimally dissipated via the FinJFETs that are at low resistance during the ESD event and the transistor fingers, that is to say the individual fins, of the driver transistor are ideally not damaged.

As shown in FIG. 2A, the first connection regions 202 (also called drain regions) of the two FinJFETs 201 (and possibly of further FinJFETs) are connected to one another and form a common heavily n doped (n+ doped) drain region. The second connection regions 203 (also called source regions) of the two FinJFETs 201 are likewise connected to one another and form a common heavily n doped (n+ doped) source region. The common drain region is furthermore connected to the drain regions of the individual transistor fingers or fins of the driver transistor (not shown). Furthermore, the common source region is connected to the source regions of the individual transistor fingers or fins of the driver transistor (not shown).

FIG. 2B shows a cross section through one of the two gate controlled fin resistance elements 201 illustrated in FIG. 2A along the broken sectional line A-A', that is to say along the longitudinal axis of the fin structure. The illustration shows the heavily n doped (n+ doped) first connection region 202 (also called drain region), the heavily n doped (n+ doped) second connection region 203 (also called source region) and also the weakly n doped (n− doped) channel region 204 formed between the first connection region 202 and the second connection region 203. The gate region 205 is formed over the channel region 204 (cf. FIG. 2A) which gate region 205 has the thin gate insulating layer 205a formed on the channel region 204 and the conductive gate layer 205b formed on the gate insulating layer 205a. The connection regions 202 and 203 and also the channel region 204 are formed on the insulating silicon dioxide layer 207, which, for its part is formed on the silicon substrate 206. The first connection region or drain region 202 is electrically coupled to an electrical supply voltage source which provides an electrical supply potential VDD. The second connection region or source region 203 is connected to a ground potential.

As an alternative, the first connection region or drain region 202 may be connected to an I/O pin and the second connection region or source region 203 may be connected to the ground potential, or the drain region 202 may be connected to the VDD potential, while the source region 203 is connected to the I/O pin.

FIG. 2B furthermore shows a gate control device 208, which is electrically coupled to the gate region, more precisely to the conductive gate layer 205b. The gate control device 208 is electrically connected to the electrical supply potential VDD via one electrical connection and to the ground potential or VSS potential via a further electrical connection. The gate control device 208 may furthermore be electrically connected to further sense pins (not shown). With the aid of the gate control device 208, an electrical potential VG having a predetermined value can be applied to the gate region 205 and be controlled in such a way that the gate controlled fin resistance element 201 has a high electrical resistance during a first operating state of the electrical circuit, and that the gate controlled fin resistance element 201 has a lower electrical resistance during a second operating state of the electrical circuit, said second operating state being characterized by the occurrence of an ESD event.

The function of the gate control device is explained in more detail with reference to FIG. 3A and FIG. 3B. FIG. 3A shows the cross-sectional view of the gate controlled resistance element 201 from FIG. 2B, the connections of the first connection region 202 to the electrical supply potential VDD and the connection of the second connection region 203 to the ground potential having been omitted in order to simplify the illustration. Furthermore, the gate region 205 electrically coupled to the gate control device 208 is illustrated only symbolically by the electrode 205 depicted over the channel region 204.

FIG. 3A shows the behavior of the gate controlled fin resistance element 201 during a first (normal) operating state of the electrical circuit, to put it another way under normal operation, in which first operating state the electrical circuit is supplied with an external operating voltage ("powered" state). With the aid of the gate control device 208, an electrical potential VG having a much lower value than the drain potential VD, that is to say that VG<<VDrain, is provided at the gate region 205 formed over the channel region 204. The gate region 205 thus has a negative bias relative to the drain region 202, as a result of which a greatly extended space charge zone 209 forms in the channel region 204 and pinches off the channel region 204 (pinch-off). The FinJFET 201 therefore has a high electrical resistance. Since the channel region 204 is almost fully depleted of free charge carriers, only a very low leakage current Ileak flows through the channel region 204 of the FinJFET 201 in the first operating state. The FinJFET 201 is therefore clearly switched off, identified as "off" state in FIG. 3A.

FIG. 3B shows the behavior of the gate controlled fin resistance element 201 during a second operating state of the electrical circuit, that is to say when an electrostatic discharge or an ESD event occurs. During an ESD event, no external operating voltage is present at the FinJFET 201 ("non-powered" state), and the electrical potential VG applied to the gate region 205 is in this case controlled by the gate control device in such a way that the value VG of the gate potential is approximately equal to the drain potential VDrain, that is to say that VG~VDrain. As a result, the extent of the space charge zone 209 in the channel region 204 decreases significantly in the second operating state in comparison with that in the first operating state, and the electrical resistance of the FinJFET 201 likewise decreases accordingly. To put it another way, the depletion of free electrical charge carriers decreases in the channel region 204. The FinJFET 201 acquires low resistance, and a significant electric current Ion flows through the channel region 204 of the FinJFET 201; the FinJFET 201 is in a conducting state (identified as "on" state in FIG. 3B). In the conducting state, the gate controlled fin resistance element 201 formed as a FinJFET 201 therefore clearly acts as a lightening arrestor.

Figure 4A:
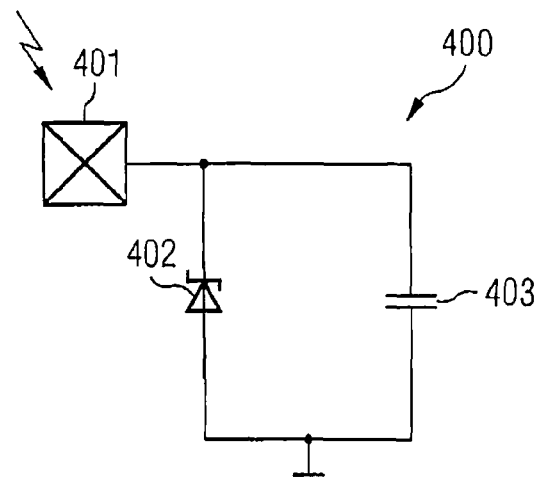
FIG. 4A illustrates an electrical circuit diagram for illustrating the ESD protection effect of a gate controlled fin resistance element.
Figure 4B:
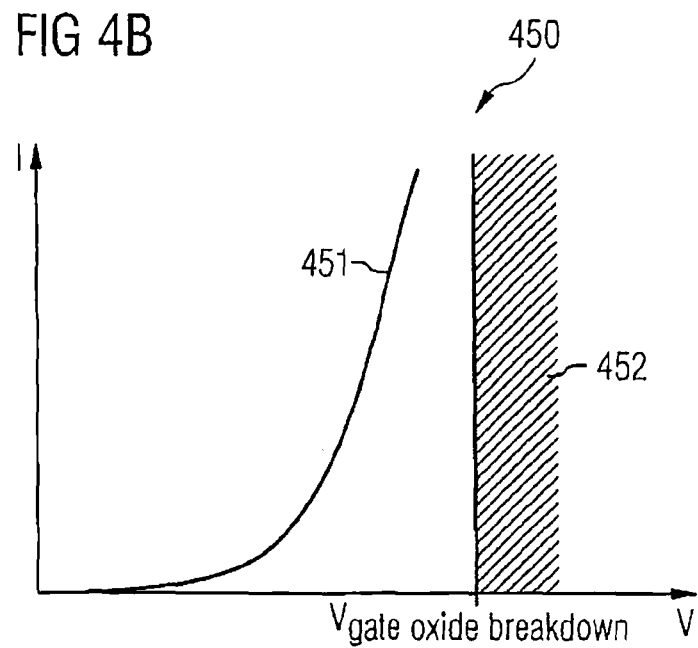
FIG. 4B illustrates a current-voltage characteristic of a gate controlled fin resistance element formed as a fin junction field effect transistor in accordance with another exemplary embodiment of the invention.

The FinJFET 201 additionally has a very good current-voltage characteristic, which is explained in more detail with reference to FIG. 4A and FIG. 4B. FIG. 4A shows an electrical circuit diagram 400 for illustrating the mode of operation of the gate controlled fin resistance element or FinJFET 201 as ESD protection element. In the circuit diagram 400, an ESD protection element 402 is connected in parallel with a capacitance 403, representing the capacitance 403 of a thin gate oxide layer. The ESD protection element 402 (for example the FinJFET 201) and the gate oxide capacitance 403 are electrically coupled to a contact pad 401. During an ESD event, a great voltage spike or voltage pulse occurs at the contact pad 401 (represented by the lightening in FIG. 4A), and high ESD current has to be dissipated through the circuit 400. On account of the favorable current-voltage characteristic of the ESD protection element 402 (that is to say of the FinJFET), which characteristic is shown in FIG. 4B, the ESD current flows away virtually completely via the left-hand branch of the circuit 400, that is to say via the ESD protection element 402 (FinJFET).

It can be gathered from the current-voltage characteristic (I-V characteristic) 450 shown in FIG. 4B that even at voltages that are significantly below the breakdown voltage of the gate oxide, the current flow through the FinJFET rises steeply (curve 451 in FIG. 4B), so that the critical range illustrated in hatched fashion in FIG. 4B, that is to say the voltage range in which a breakdown of the gate oxide occurs, which may lead to the destruction of the gate oxide and thus of the resistance element, is not reached since the high ESD current can flow away via the ESD protection element 402, that is to say the FinJFET, and the voltage spike occurring as a result of the ESD event is thereby attenuated.

Figure 5A:
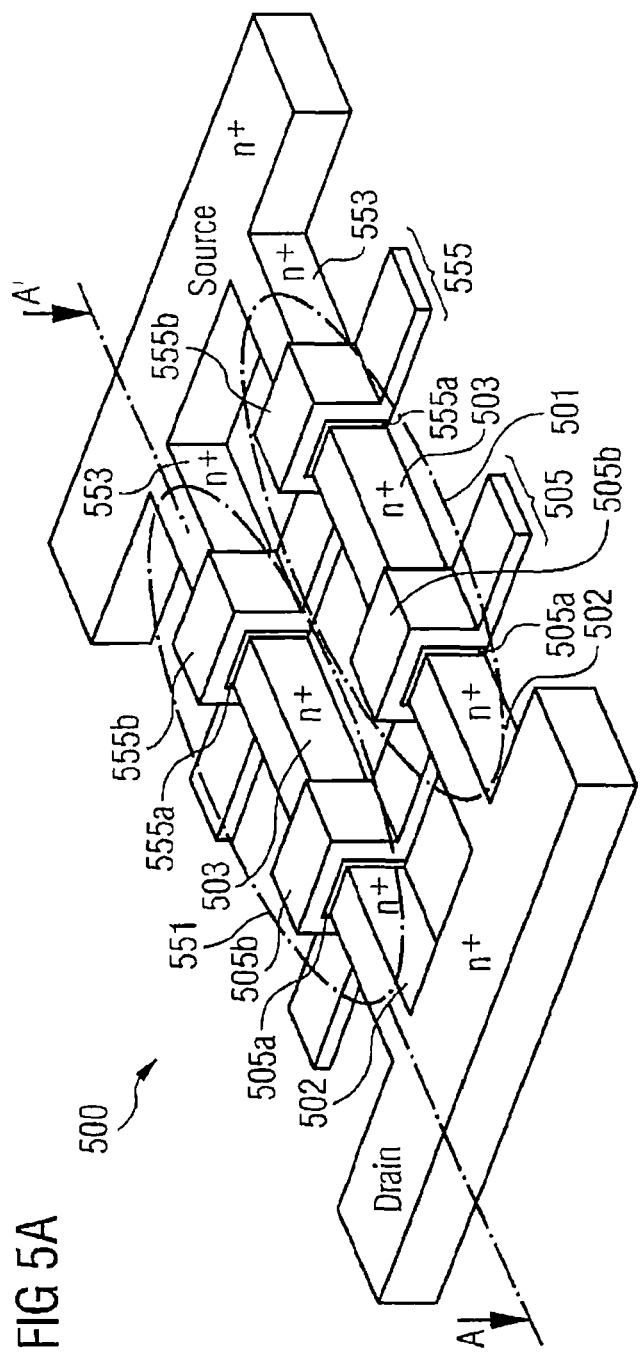
FIG. 5A illustrates a device for protection against electrostatic discharges in an electrical circuit with two gate controlled fin resistance elements formed as a serial ballast resistor in accordance with another exemplary embodiment of the invention.

FIG. 5A shows a device 500 for protection against electrostatic discharges in an electrical circuit with two gate controlled fin resistance elements 501 formed as serial ballast resistors in accordance with another exemplary embodiment of the invention. The gate controlled fin resistance elements 501 have a fin structure, having in each case a heavily n doped first connection region 502, a heavily n doped second connection region 503 and also a weakly n doped channel region 504 formed between the first connection region 502 and the second connection region 503, the channel region 504 being concealed by a gate region or gate 505 formed over the side areas and the upper face of the channel region 504, cf. FIG. 5B.

The gate controlled fin resistance elements 501 have a similar fin structure as the gate controlled fin resistance elements 201 formed as FinJFET and shown in FIG. 2A. In contrast to the FinJFETs 201, however, the gate controlled fin resistance elements 501 here are formed as serial ballast resistors in the individual fingers or fins 551 of a transistor based on fin technology, e.g. a driver transistor. To put it more precisely, the gate controlled fin resistance elements 501 are formed in the drain region of the transistor or in the drain regions of the individual transistor fingers 551.

In an alternative embodiment of the invention, the gate controlled fin resistance elements 501 formed as ballast resistors may be formed in the source region of the transistor or the source regions of the individual transistor fingers (fins) 551. In other words, a gate controlled fin resistance element 501 formed as a ballast resistor is for example part of a transistor finger 551 as shown in FIG. 5A.

Since the gate controlled fin resistance elements 501 are formed in the drain region of the transistor or the transistor fingers (fins) 551, the first connection regions 502 of the gate controlled fin resistance elements 501 are also referred to hereinafter as first drain regions 502 and the second connection regions 503 of the gate controlled fin resistance elements 501 are also referred to as second drain regions 503. FIG. 5A additionally illustrates weakly n doped (n– doped) source regions 553 of the two transistor fingers 551. A weakly p doped (p– doped) channel region 554 of the transistor finger 551 is formed between the second drain region 503 of a gate controlled fin resistance element 501 and the source region 553 of the transistor finger 551, which channel region 554 is concealed, however, by a gate region 555 or gate 555 of the transistor finger 551 that is formed over the side areas and the upper face of the channel region 554, cf. FIG. 5B. The fin structures of the gate controlled fin resistance elements 501 formed as serial ballast resistors preferably have a length of between 10 nm and 10 µm, and a width of between 5 nm and 50 nm, and a height of between 5 nm and 200 nm.

Analogously to the exemplary embodiment described above, the two gate controlled fin resistance elements of the device 500 that are formed as ballast resistors are connected in parallel with one another, and the gate region or the gate 505 is formed as a common gate region or common gate 505, a thin gate insulating layer 505a made of silicon dioxide in each case being formed on a part of the channel region 504 of each ballast resistor 501. To put it more precisely, the gate insulating layer 505a is formed on the side areas and on the upper face of each ballast resistor 501. The gate insulating oxide layer may have a thickness of approximately 2 nm. Furthermore, a conductive gate layer 505b made of p doped polysilicon is formed on the gate insulating layer 505a of each ballast resistor 501 and also on an electrically insulating silicon dioxide layer 507 formed on a silicon substrate 506 (cf. FIG. 5B).

In an alternative embodiment of the invention, the gate insulating layer 505a may be dispensed with, and the conductive gate layer 505b may be formed directly on a part of the surface of the channel region 504. With the aid of the common gate region 505, the two gate controlled fin resistance elements 501 formed as ballast resistors (and optionally also even further ballast resistors connected in parallel (not shown)) can be driven jointly. In the case of each gate controlled fin resistance element 501, the thin gate insulating oxide layer 505a is formed on the two side areas and the upper face of the channel region 504 of the fin structures 501, so that the channel region 504 can be driven from three sides with the aid of the gate region 505. The fin structures 501 shown in FIG. 5A are therefore triple gate structures.

In accordance with alternative embodiments of the invention, the channel region 504 may also be driven merely from two sides (for example the two side areas), or from four sides (cf. FIG. 7C).

The device 500 may be formed in an electrical circuit or an IC in such a way that the two gate controlled fin resistance elements 501 formed as ballast resistors (and possibly further ballast resistors (not shown)) are connected in series with one or more elements of the electrical circuit or IC that is or are to be protected against an ESD event. The element to be protected is for example a field effect driver transistor based on fin technology and having a plurality of transistor fingers 551 or fins 551. A gate controlled fin resistance element 501 is in each case connected in series in each transistor finger 551 or in each fin 551 of the driver transistor, so that during an ESD event, that is to say an electrostatic discharge, a high ESD current, through the ballast resistors 501 formed in each fin 551, is distributed uniformly between all the transistor fingers 551 or fins 551, and a homogeneous (ideally as low as possible) current density is thus achieved via all the fins 551 together, so that the driver transistor (generally an element to be protected against an ESD event) has a high intrinsic robustness.

As shown in FIG. 5A, the first connection regions 502 (also called first drain regions 502) of the two gate controlled fin resistance elements 501 formed as ballast resistors (and possibly further ballast resistors) are connected to one another and form a common heavily n doped (n+ doped) first drain region. The connection regions 553 (also called source regions 553) of the two transistor fingers 551 are likewise connected to one another and form a common heavily n doped (n+ doped) source region.

FIG. 5B shows a cross section through one of the two transistor fingers 551 illustrated in FIG. 5A with a gate controlled fin resistance element 501 formed as a serial ballast resistor along the broken sectional line A-A', that is to say along the longitudinal axis of the fin structure. The illustration shows the heavily n doped (n+ doped) first connection region 502 of the gate controlled fin resistance element (also called first drain region), the heavily n doped (n+ doped) second connection region 503 of the gate controlled fin resistance element (also called second drain region), and the weakly n doped (n– doped) channel region 504 of the gate controlled fin resistance element 501 that is formed between the first connection region 502 and the second connection region 503. The gate region 505 of the gate controlled fin resistance element 501 is formed over the channel region 504 of the gate controlled fin resistance element (cf. FIG. 5A), which gate region 505 has the thin gate insulating layer 505a formed on the channel region 504 of the gate controlled fin resistance element 501 and the conductive gate layer 505b formed on the gate insulating layer 505a.

FIG. 5B furthermore shows the heavily n doped (n+ doped) source region 553 of the transistor finger and also the weakly p doped (p– doped) channel region 554 of the transistor finger that is formed between the second drain region 503 and the source region 553.

The gate region 555 of the transistor finger is formed over the channel region 554 of the transistor finger (cf. FIG. 5A) which gate region 555 has the thin gate insulating layer 555a formed on the channel region 554 of the transistor finger and the conductive gate layer 555b formed on the gate insulating layer 555a.

The fin structure of the gate controlled fin resistance element 501 or of the transistor finger, that is to say the connection regions 502, 503 and 553 and also the channel regions 504 and 554, are formed on the insulating silicon dioxide layer 507, which is in turn formed on the silicon substrate 506. The first connection region 502 or first drain region 502 of the gate controlled fin resistance element 501 is electrically coupled (for example via a contact pad) to an electrical supply voltage source which provides an electrical supply potential VDD. The second connection region or second drain region 503 is electrically coupled to the gate region 505 or the conductive gate layer 505b, so that an electrical potential VG1 is established at the gate region 505 of the gate controlled fin resistance element 501 by means of a feedback effect. In other words, the gate potential VG1 is not fixedly predetermined externally, but rather is established as a result of the feedback itself. A predetermined electrical potential VG2 for controlling the transistor is provided at the gate region 555 or the conductive gate layer 555b of the transistor finger 551, and the source region 553 of the transistor finger 551 is connected to the ground potential.

FIG. 5C shows another exemplary embodiment of the invention, in which a gate control device 508 is formed in addition to the arrangement shown in FIG. 5B, which gate control device 508 is electrically coupled to the gate region 505 or to the conductive gate layer 505b of the gate controlled fin resistance element 501. With the aid of the gate control device 508, a predetermined low electrical potential VG1 can be provided at the gate region 505 during a first (normal) operating state of the electrical circuit, while the electrical circuit or IC is supplied with voltage. It is thereby possible for example to further reduce the resistance of the gate controlled fin resistance element 501 in the first (normal) operating state.

The function of the gate controlled fin resistance element 501 formed as a ballast resistor is explained in more detail below with reference to FIGS. 6A and 6B. FIG. 6A shows the gate controlled fin resistance element 501 formed as a serial ballast resistor in a transistor fin 551 during a first (normal) operating state of the electrical circuit, that is to say under normal operation. In the first operating state, the electrical circuit is supplied with an operating voltage ("powered" state) and an electric current having a low current intensity flows through the transistor finger 551 and thus also through the ballast resistor 501. The gate region 505 (identified symbolically as electrode 505 in FIG. 6A) formed over the channel region 504 of the ballast resistor 501 is electrically coupled to the second connection region 503 (or second drain region 503) of the ballast resistor 501. Therefore, the same electrical potential VG1 as at the second connection region 503 is present at the gate region 505. On account of the low current intensity, only a small voltage drop occurs between the first connection region 502 (first drain region) and the second connection region 503 (second drain region), so that the electrical potential VG1 at the gate region 505 is approximately equal to the electrical potential of the first drain region 502. Therefore, only a relatively small space charge zone 509 forms in the channel region 504. To put it another way, during the first (normal) operating state of the electrical circuit, no significant depletion of free electrical charge carriers occurs in the channel region 504, and the gate controlled fin resistance element 501 formed as a ballast resistor has a low electrical resistance. The current flow through the transistor finger 551 is thus not significantly restricted by the ballast resistor 501 under normal operation, and the function of the transistor is therefore not restricted.

However, as soon as the current level (current flow) through the transistor finger 551 rises in a second operating state of the electrical circuit, for example on account of an ESD event, a significant voltage drop occurs between the first drain region 502 and the second drain region 503. As a consequence of this, the gate potential VG1 has a negative bias relative to the potential of the first drain region 502. The gate region 504 thus has a significantly lower electrical potential VG1 than the first drain region 502. This results in a great depletion of free electrical charge carriers in the channel region 504 of the gate controlled fin resistance element 501. The extent of the space charge zone 509 in the channel region 504 thus increases, as a result of which the electrical resistance of the gate controlled fin resistance element 501 rises significantly. To put it in yet another way, the gate controlled fin resistance element 501 formed as a ballast resistor has a significantly higher electrical resistance in the second operating state, which is characterized by the occurrence of an ESD event, than in the first operating state.

As soon as an extended depletion zone 509 has formed in the channel region 504, it brings about an even higher voltage drop between the first drain region 502 and the second drain region 503, as a result of which, in turn, the depletion zone 509 extends even further. This negative feedback loop stabilizes the current flow and ensures a homogeneous distribution of the current constrained by the ESD discharge between the individual transistor fingers 551 or fins, that is to say the individual fin structures of a transistor to be protected (e.g. driver transistor).

FIGS. 7A to 11 show further exemplary embodiments of the invention. In this case, FIGS. 7A to 7D essentially serve to illustrate various possibilities for forming the gate region, more precisely the gate insulating layer, over the channel region of a gate controlled fin resistance element formed as a FinJFET. FIGS. 8A to 10 essentially serve to illustrate various possibilities for the doping of the connection regions and the channel regions of a gate controlled fin resistance element formed as a serial ballast resistor. FIG. 11 shows a device for protection against electrostatic discharges, having a plurality of gate controlled fin resistance elements formed as ballast resistor, which ballast resistors are connected in series with a planar transistor.

FIG. 7A shows a cross section through the gate region 205 of a gate controlled fin resistance element 201 formed as a FinJFET along the sectional line B-B' shown in FIG. 2A that is to say along the longitudinal axis of the gate region 205 or along the transverse axis of the FinJFET 201. In the exemplary embodiment shown, the gate insulating layer 205a (for example made of silicon dioxide) formed on the channel region 204 is formed with a larger thickness on the upper face 204b of the channel region 204 than on the two side areas 204a of the channel region 204. The thickness of the gate insulating layer 205a on the side areas 204a is approximately 2 nm in this case, by way of example. The conductive gate layer 205b (for example made of polysilicon) is formed on the gate insulating layer 205a and the buried oxide layer 207 formed on the silicon substrate 206. The fact that the gate insulating layer 204 has a larger thickness on the upper face 204b of the channel region than on the side areas 204a of the channel region 204 has the effect that the channel region 204 can be driven from two sides, that is to say the two side areas 204a, with the aid of the conductive gate layer 205b. The structure shown in FIG. 7A therefore constitutes a double gate FinJFET structure or FinJFET structure for short. The channel region 204 may be weakly n doped or weakly p doped (the connection regions 202 and 203 (not shown) correspondingly being heavily n doped or heavily p doped). If the FinJFET structure has for example a weakly n doped channel region 204 (represented by n– in FIG. 7A), an n-FinJFET structure is involved. If, as an alternative, the FinJFET structure has a weakly p doped channel region 204 (represented by p– in FIG. 7A), a p-FINJFET structure is involved.

FIG. 7B shows a cross-sectional view through a gate region 205 equivalent to FIG. 7A, with the difference though that that part of the gate insulating layer 205a formed on the channel region 204 which is formed on the upper face 204b of the channel region has the same thickness as those parts of the gate insulating layer 205a which are formed on the side areas 204a of the channel region 204. In other words, the gate insulating layer 205a formed on the channel region 204 has the same thickness (e.g. 2 nm) everywhere. What is thereby achieved is that the channel region 204 can be driven from three sides with the aid of the conductive gate layer 205b formed on the gate insulating layer 205a. The structure shown in FIG. 7B therefore constitutes a triple gate FinJFET structure or MuGJFET structure.

Analogously to above, a MuGJFET structure having a weakly n doped channel region 204 is an n-MuGJFET, and a MuGJFET structure having a weakly p doped channel region 204 is a p MuGJFET.

FIG. 7C shows a cross-sectional view through a gate region 205 equivalent to FIG. 7A and FIG. 7B, with the difference though that the gate insulating layer 205a is formed on all four sides of the channel region 204. In other words, the gate insulating layer 205a is formed on the two side areas 204a of the channel region 204, the upper face 204b of the channel region 204 and the lower face 204c of the channel region 204. The gate insulating layer 205a has the same small thickness everywhere, e.g. approximately 2 nm. The conductive gate layer 205b is in turn formed on the gate insulating layer 205a, that is to say that the conductive gate layer 205b completely surrounds the gate insulating layer 205a in the exemplary embodiment shown. Consequently, the channel region 204 can be driven from all four sides with the aid of the conductive gate layer 205b. A MuGJFET structure is thus involved.

The MuGJFET structure shown in FIG. 7C is also referred to as SON-JFET structure (Silicon-On-Nothing JFET) since, in order to form the gate insulating layer 205a, firstly a freely suspended ridge or a freely suspended bridge is formed by undercutting a fin structure, as shown in FIG. 7D. The gate insulating layer 205a is subsequently formed on the channel region 204 of the freely suspended ridge structure, having a first connection region 202, a second connection region 203 and also the channel region 204, and the conductive gate layer 205b is formed on the gate insulating layer 205a. FIG. 7D shows the freely suspended ridge structure prior to the formation of the gate insulating layer 205a and the conductive gate layer 205b. The illustration in FIG. 7C emerges as a cross section along the broken sectional line B-B' after the formation of the gate insulating layer 205a and the conductive gate layer 205b.

A freely suspended ridge or a freely suspended bridge may be formed by forming a mono SiGe layer on a silicon substrate by means of a selective epitaxy method (selective epitaxial growth, SEG), and by likewise forming a silicon layer on the mono SiGe layer by means of a selective epitaxy method. The fin structure is then formed on the silicon layer. The SiGe layer is selectively isotropically removed (for example by selective isotropic etching), so that a tunnel arises beneath the fin structure. The tunnel may be filled with a dielectric material in another process step.

FIG. 8A shows a gate controlled fin resistance element 501 formed as a serial ballast resistor in a transistor finger 551. The ballast resistor 501 has a first heavily n doped connection region (drain region) 502, a second heavily n doped connection region (drain region) 503 and also a weakly n doped channel region 504 formed between the first drain region 502 and the second drain region 503. The ballast resistor 501 connected in series is formed in the drain region of a transistor finger 551 or a fin of an n channel field effect transistor (n FET) having a weakly p doped channel region 554 and a heavily n doped source region 553. The gate region 505 formed over the channel region 504 of the ballast resistor 501 is represented symbolically by the electrode 505 with the electrical potential VG1. The gate 555 of the p-FET is analogously represented symbolically as an electrode 555 with the potential VG2.

FIG. 8B shows an illustration—equivalent to FIG. 8A of a ballast resistor 501 formed in the drain region of a p-channel field effect transistor (p FET) 551 and having heavily p doped (p+ doped) connection regions (drain regions) 502 and 503 and also a weakly p doped (p– doped) channel region 504.

Figure 9A:
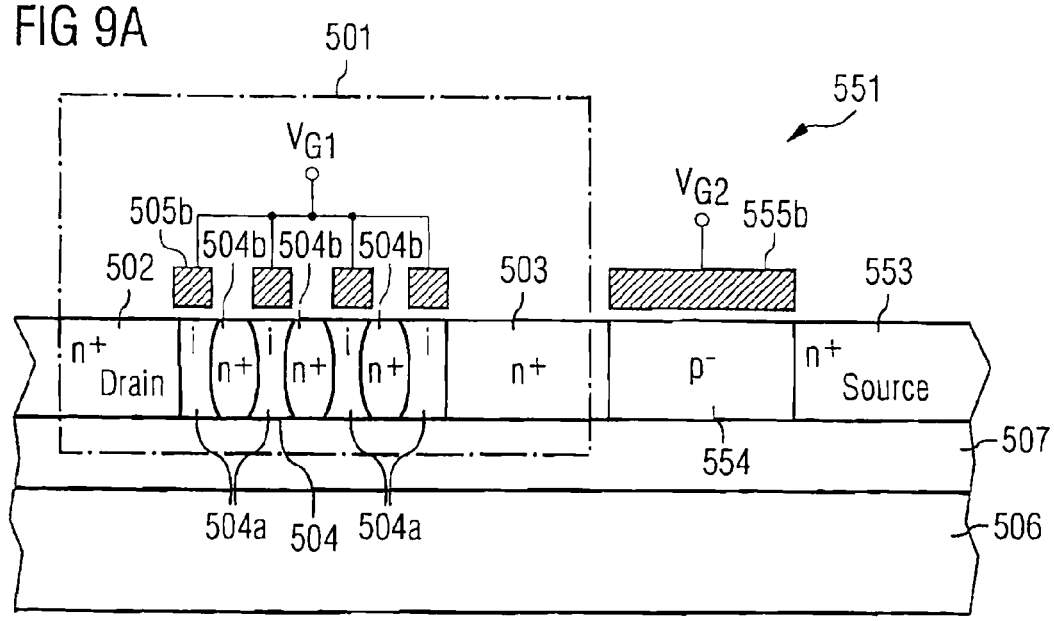
FIG. 9A shows a cross-sectional view of a gate controlled fin resistance element formed as a ballast resistor in accordance with another exemplary embodiment of the invention.

FIG. 9A shows an illustration of a ballast resistor 501 formed in the drain region of an n-channel field effect transistor (n-FET) 551 and having heavily n doped (n+ doped) connection regions (drain regions) 502 and 503 and also a channel region 504, which has a plurality of first partial regions 504a and a plurality of second partial regions 504b, the first partial regions 504a having an intrinsic conductivity, and the second partial regions 504b being heavily n doped (n+ doped). The first partial regions 504a and the second partial regions 504b are formed alternately alongside one another and thus form an alternate sequence. The number of first partial regions 504a (four in the example shown) is greater than the number of second partial regions 504b (three in the example shown) and the channel region 504 is therefore delimited at its two outer ends by a first partial region 504a in each case. The gate region or the conductive gate layer 505b is formed over the first partial regions 504a of the channel region 504.

Figure 9B:
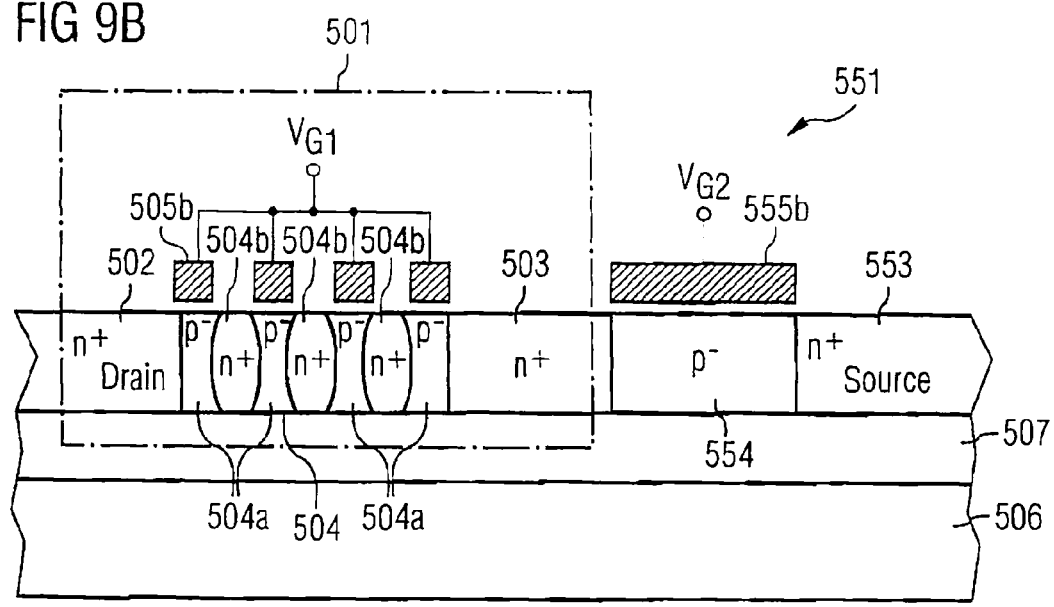
FIG. 9B illustrates a cross-sectional view of a gate controlled fin resistance element formed as a ballast resistor in accordance with another exemplary embodiment of the invention.

FIG. 9B shows an illustration—analogous to FIG. 9A—of a ballast resistor 501 formed in the drain region of an n-channel field effect transistor (n-FET) 551 and having heavily n doped connection regions (drain regions) 502 and 503 and also a channel region 504, which has an alternate sequence of first partial regions 504a and second partial regions 504b. In contrast to FIG. 9A, the first partial regions 504a are weakly p doped (p− doped).

Alternative exemplary embodiments (not shown) in which a ballast resistor is formed in series with a p-channel field effect transistor (p-FET) are immediately apparent if the n doped doping and the p doped doping are interchanged with one another in FIG. 9A or in FIG. 9B.

Figure 10:
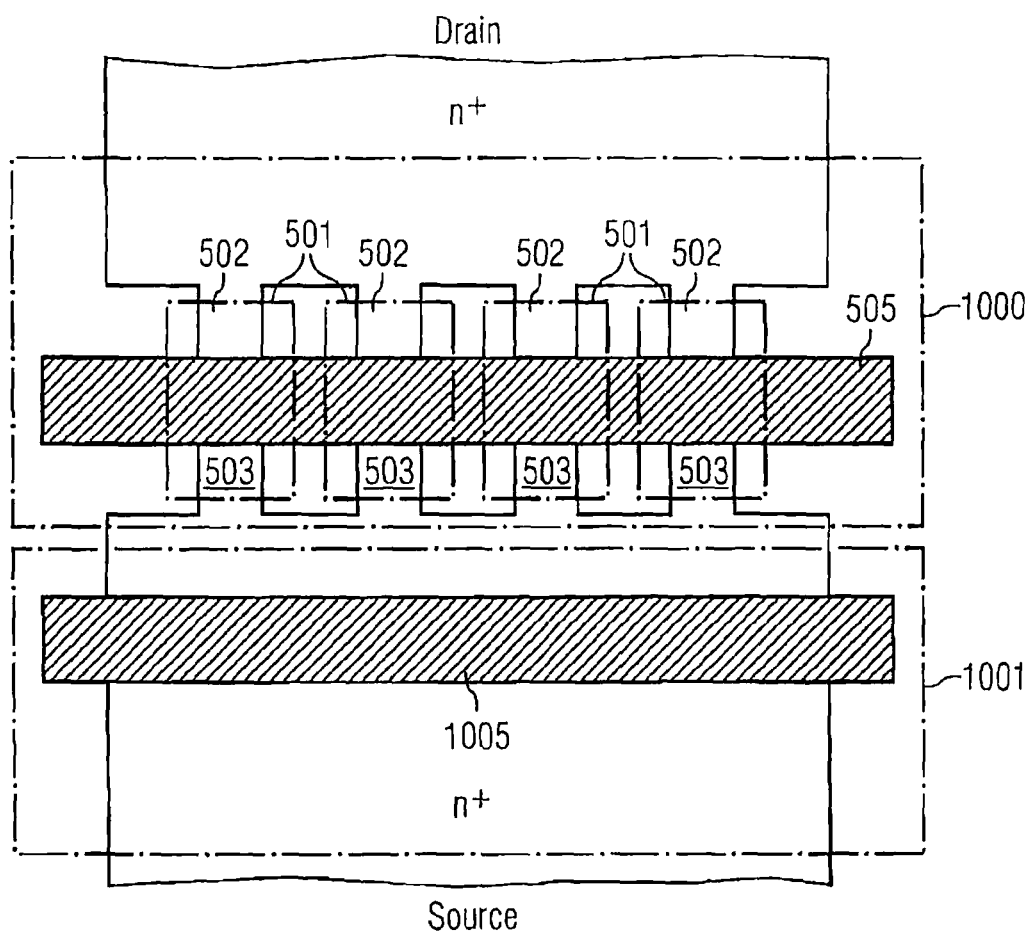
FIG. 10 illustrates a device for protection against electrostatic discharges in an electrical circuit as ESD protection for a partially depleted field effect transistor in accordance with another exemplary embodiment of the invention.

FIG. 10 shows a plan view of a device for protection against electrostatic discharges 1000, which serves as ESD protection for a planar PD transistor (partially depleted transistor) 1001. The device 1000 has a plurality of gate controlled fin resistance elements 501 connected in parallel and formed as ballast resistors, which ballast resistors are connected in series with the planar PD transistor 1001. The PD transistor is controlled via the gate 1005, and the channel regions of the ballast resistors 501 are controlled with the aid of a common gate region or gate 505. By means of the fin structure of the ballast resistors 501, an optimum control effect by the gate region 505 is ensured and an effective depletion of free electrical charge carriers is thereby achieved in the channel regions of the individual gate controlled fin resistance elements 501, which leads to an effective protection of the PD planar transistor 1001 during an electrostatic discharge or an ESD event.

Although exemplary embodiments of the present invention and their advantages have been described in detail, it should be noted that various changes, substitutions and alterations can be made herein without departing from the spirit and scope of the invention as defined by the appended claims. For example, it will be readily understood by those skilled in the art that many of the features, functions, processes and materials described herein can be varied while remaining within the scope of the present invention. Moreover, it is not intended to restrict the scope of the present invention to the specific embodiments of the process, machine, production, material composition, means, methods or steps which are mentioned in the description. As can readily be inferred from the disclosure of the present invention by those skilled in the art, it is possible in accordance with the present invention also to utilize processes, machines, production methods, material compositions, means, methods or steps which exist at the present time or will be developed in the future and which essentially fulfill the same task or essentially achieve the same result as the corresponding embodiments that have been described herein. Accordingly, the appended claims are intended to include within their scope such processes, machines, production methods, material compositions, means, methods or steps.

The invention claimed is:

1. A fin pinch resistor for use as ESD protection element in an electrical circuit, comprising:
    an electrically insulating layer;
    a fin structure formed on the electrically insulating layer, the fin structure having a first connection region, a second connection region and a channel region formed between the first connection region and the second connection region, wherein the connection regions and the channel region are either all n-doped or all p-doped, wherein the channel region is doped down to the electrically insulating layer, and wherein, during a first operating state of the electrical circuit, the first connection region is electrically coupled to a high electrical potential and the second connection region is electrically coupled to a lower electrical potential in case that the connection regions are n-doped and the first connection region is electrically coupled to a low electrical potential and the second connection region is electrically coupled to a higher electrical potential in case that the connection regions are p-doped, said first operating state being a normal operating state of the electrical circuit;
    a gate region formed at least over a part of the surface of the channel region;
    a gate control circuit, which is electrically coupled to the gate region and which is configured to control an electrical potential applied to the gate region in such a way that the channel region is pinched off during the first operating state of the electrical circuit, and that the electrical potential at the gate region follows an electrical potential at the first connection region during a second operating state of the electrical circuit, said second operating state being characterized by the occurrence of an ESD event.

2. The fin pinch resistor as claimed in claim 1, the gate region having an electrically conductive gate layer formed at least on a part of the surface of the channel region.

3. The fin pinch resistor as claimed in claim 1, the gate region comprising:
    a gate insulating layer formed at least on a part of the surface of the channel region;
    an electrically conductive gate layer formed at least on the gate insulating layer.

4. The fin pinch resistor as claimed in claim 1, the first connection region and/or the second connection region and/or the channel region comprising silicon material.

5. The fin pinch resistor as claimed in claim 1, the fin structure having a length of between 10 nm and 10 µm, and a width of between 5 nm and 50 nm, and a height of between 5 nm and 200 nm.

6. The fin pinch resistor as claimed in claim 1, the first connection region being electrically coupled to an electrical supply voltage source.

7. The fin pinch resistor as claimed in claim 3, the electrically conductive gate layer comprising one of the following materials: titanium nitride, silicide, carbon, polysilicon, a metallic compound with a suitable work function.

8. The fin pinch resistor as claimed in claim 3, the gate insulating layer comprising silicon dioxide or a material having a high dielectric constant.

9. The fin pinch resistor as claimed in claim 3, the gate insulating layer having a thickness of at least 2 nm.

10. The fin pinch resistor as claimed in claim 7, the electrically conductive gate layer comprising p doped polysilicon material.

11. A device for protection against electrostatic discharges in an electrical circuit, having at least one fin pinch resistor, comprising:
- an electrically insulating layer;
- a fin structure formed on the electrically insulating layer, the fin structure having a first connection region, a second connection region and a channel region formed between the first connection region and the second connection region, wherein the connection regions and the channel region are either all n-doped or all p-doped, wherein the channel region is doped down to the electrically insulating layer, and wherein, during a first operating state of the electrical circuit, the first connection region is electrically coupled to a high electrical potential and the second connection region is electrically coupled to a lower electrical potential in case that the connection regions are n-doped and the first connection region is electrically coupled to a low electrical potential and the second connection region is electrically coupled to a higher electrical potential in case that the connection regions are p-doped, said first operating state being a normal operating state of the electrical circuit;
- a gate region formed at least over a part of the surface of the channel region;
- a gate control circuit, which is electrically coupled to the gate region and which is configured to control an electrical potential applied to the gate region in such a way that the channel region is pinched off during the first operating state of the electrical circuit, and that the electrical potential at the gate region follows an electrical potential at the first connection region during a second operating state of the electrical circuit, said second operating state being characterized by the occurrence of an ESD event.

12. The device as claimed in claim 11, further comprising a plurality of fin pinch resistors having a common gate region.

13. The device as claimed in claim 11, further comprising:
- a substrate;
- the electrically insulating layer being formed on the substrate.

14. An ESD protection element, comprising:
- an electrically insulating layer;
- a fin disposed on the electrically insulating layer, the fin having a first connection region, a second connection region and a channel region between the first and second connection regions, wherein the first and second connection regions and the channel region are either all n-doped or all p-doped, and wherein the channel region is doped down to the electrically insulating layer;
- a gate region disposed over the channel region;
- a gate control circuit coupled to the gate region, the gate control circuit applying a first electrical potential to the gate region during a normal operating state, and applying a second electrical potential to the gate region during an ESD event, wherein the first electrical potential substantially depletes the channel region of free charge carriers, and wherein the second electrical potential reduces the charge carrier depletion in the channel region.

15. The ESD protection element as claimed in claim 14, wherein, during the normal operating state, the first connection region is electrically coupled to a high electrical potential and the second connection region is electrically coupled to a lower electrical potential in case that the connection regions are n-doped and the first connection region is electrically coupled to a low electrical potential and the second connection region is electrically coupled to a higher electrical potential in case that the connection regions are p-doped.

16. The ESD protection element as claimed in claim 14, the gate region comprising an electrically conductive gate layer disposed on the channel region.

17. The ESD protection element as claimed in claim 14, the gate region comprising:
- a gate insulating layer disposed on the channel region;
- an electrically conductive gate layer disposed on the gate insulating layer.

18. An electrical circuit, comprising:
- at least one circuit element to be protected against an ESD event;
- an ESD protection element connected in parallel to the at least one circuit element, the ESD protection element comprising:
  - an electrically insulating layer;
  - a fin disposed on the electrically insulating layer, the fin having a first connection region, a second connection region and a channel region between the first and second connection regions, wherein the first and second connection regions and the channel region are either all n-doped or all p-doped, and wherein the channel region is doped down to the electrically insulating layer;
  - a gate region disposed over the channel region;
  - a gate control circuit coupled to the gate region, the gate control circuit applying a first electrical potential to the gate region during a normal operating state of the electrical circuit, and applying a second electrical potential to the gate region during the ESD event, wherein the first electrical potential substantially depletes the channel region of free charge carriers, and wherein the second electrical potential reduces the charge carrier depletion in the channel region.

19. The electrical circuit as claimed in claim 18, wherein, during the normal operating state of the electrical circuit, the first connection region is electrically coupled to a high electrical potential and the second connection region is electrically coupled to a lower electrical potential in case that the connection regions are n-doped and the first connection region is electrically coupled to a low electrical potential and the second connection region is electrically coupled to a higher electrical potential in case that the connection regions are p-doped.

20. The electrical circuit as claimed in claim 18, the gate region comprising an electrically conductive gate layer disposed on the channel region.

21. The electrical circuit as claimed in claim 18, the gate region comprising: a gate insulating layer disposed on the channel region;
- an electrically conductive gate layer disposed on the gate insulating layer.

22. The electrical circuit as claimed in claim 18, the first connection region being electrically coupled to an electrical supply voltage source.

* * * * *